United States Patent [19]

Ishikawa et al.

[11] Patent Number: 5,235,294
[45] Date of Patent: Aug. 10, 1993

[54] AUTO-TUNED APPARATUS FOR BAND-PASS FILTER

[75] Inventors: Youhei Ishikawa; Hidekazu Wada; Sadao Yamashita; Hiroyuki Kubo, all of Nagaokakyo, Japan

[73] Assignee: Murata Manufacturing Co., Ltd., Japan

[21] Appl. No.: 822,524

[22] Filed: Jan. 17, 1992

[30] Foreign Application Priority Data

Jan. 18, 1991 [JP] Japan .................... 3-004234
Dec. 20, 1991 [JP] Japan .................... 3-338425

[51] Int. Cl.$^5$ ............................... H03H 7/01
[52] U.S. Cl. ........................ 333/17.1; 333/174
[58] Field of Search ................. 333/17.1, 174

[56] References Cited

U.S. PATENT DOCUMENTS 4,426,630 1/1984 Folkmann .............. 333/17.1 X
4,462,009 7/1984 Landt et al. ............ 333/17.1

FOREIGN PATENT DOCUMENTS 1524115 11/1989 U.S.S.R. ................. 333/17.1

Primary Examiner—Paul Gensler
Attorney, Agent, or Firm—Ostrolenk, Faber, Gerb & Soffen

[57] ABSTRACT

An auto-tuned apparatus for a band-pass filter, wherein, the generated reference signals having the given frequency to be set are mixed with signals to be outputted from the band-pass filter when the reference signals have been inputted to the band-pass filter so as to multiply them for outputting the signals of the multiplied results, the signals of the direct current component from the signals of the multiplied results to be outputted are filtered, and the band-pass filter is controlled so that the center frequencies of the band-pass filter may agree with the frequencies of the reference signal in accordance with the signal of the direct current component to be outputted, whereby the center frequency of the band-pass filter can be adjusted automatically to the desired set value with simple circuit construction and precision better than in the conventional embodiment.

28 Claims, 15 Drawing Sheets

AUTO-TUNED APPARATUS FOR BAND-PASS FILTER

BACKGROUND OF THE INVENTION

The present invention generally relates to an auto-tuned apparatus, for a band-pass filter, for automatically setting a center frequency of a band-pass filter capable of changing the center frequency in accordance with the center frequency (hereinafter referred to simply as center frequency) of the signal passing band.

FIG. 15 is a block diagram of an automatic tuning type band-pass filter according to a first conventional embodiment proposed in Japanese Laid-Open Patent Application Tokaihei No. 1-105601.

In FIG. 15, the automatic tuning type band-pass filter in the first conventional embodiment comprises an isolator 101 which is adapted to pass in one direction high frequency signals to be inputted to the filter and is provided with a reflected wave coupling terminal 111, a resonator 102 operating as a band-pass filter for band-pass-filtering high frequency signals passing through the isolator 101, a drive mechanism 103 for changing the resonance frequency of the resonator 102 by the movement of a resonance frequency adjusting element (not shown) within the above described resonator 102, and a control circuit 104 for detecting with a diode D1 the high frequency signals which are outputted from the reflected wave coupling terminal 111 of the isolator 101, so as to control the drive mechanism 103 in accordance with the detected signals.

In the automatic tuning type band-pass filter, the level of the high frequency signals (hereinafter referred to as reflected signals) of the reflection power detected by the above described diode D1 is at a minimum at the resonance frequency of the above described resonator when a high frequency signal has been passed into the band-pass filter. By the use of the minimum level caused thereby, the above described control circuit 104 controls the driving mechanism 103 so as to maintain the level of the above described reflection signals at their minimum. The center frequency of the band-pass filter, which is approximately equal to the resonance frequency of the resonator 102, may thus be tuned to the frequency of the high frequency signal passing through the isolator 101.

The above described tuning operation is effected by the use of the fact that the level of the reflection signal is at a minimum at the resonance frequency of the resonator 102 in the automatic tuning type band-pass filter in the first conventional embodiment. Therefore, the problem exists that the above described tuning operation cannot be correctly effected when signals to be reflected from another channel are inputted into the automatic tuning type band-pass filter or when interference signals coming closer to the high frequency signals passing through the above described isolator 101 are inputted into the automatic tuning type band-pass filter if, for example, the automatic tuning type band-pass filter of FIG. 15 is used in a transmitter multiplexer.

The above described automatic tuning type band-pass filter is provided with one resonator 102. A multi-pole parallel connected band pass filter (hereinafter referred to as a second conventional embodiment) is disclosed in Japanese Laid-Open Patent Application Tokaihei No. 3-72701. In the multi-pole parallel connected band-pass filter, a plurality of resonators which are different respectively from each other, and have adjacent resonance frequencies, are electrically connected in parallel between the input terminal which receives the signal and the output terminal where the signal is outputted.

In order to adjust the center frequency and the band width of the multi-pole parallel connected band-pass filter in the second conventional embodiment, a network analyzer is connected to the input and output terminals of the multi-pole parallel connected band-pass filter. As sweep signals which sweep in frequency through the passband of the band-pass filter are inputted into the input terminal, the center frequencies of the individual band-pass filters are adjusted while the spectrum of the signals of the output terminal is being observed. The center frequency and the band width of the multi-pole parallel connected band-pass filter cannot be automatically adjusted, which leads to the problem that the adjustment is required to be manually effected.

SUMMARY OF THE INVENTION

Accordingly, a first object of the present invention is to provide an auto-tuned apparatus, for a band-pass filter, which is capable of automatically adjusting the center frequency of the band-pass filter to a desired set value with better precision than in the conventional embodiment.

A second object of the present invention is to provide an automatic tuning type band-pass filter which is capable of automatically adjusting the center frequency of the band-pass filter to a given set value with better precision than in the conventional embodiment.

A third object of the present invention is to provide a transmitter multiplexer or an antenna combiner coupling a plurality of RF transmitters to a single antenna, provided with a plurality of auto-tuned type band-pass filters, which are capable of correctly effecting the above described tuning operation if the signal to be reflected from another channel has been inputted to the automatic tuning type band-pass filter when, for example, the automatic tuning type band-pass filter has been used in a transmitter multiplexer.

A fourth object of the present invention is to provide an auto-tuned apparatus, for a multi-pole parallel connected band-pass filter, which is capable of automatically adjusting to the respective desired set values the center frequency and the band width of the multi-pole parallel connected band-pass filter.

A fifth object of the present invention is to provide a multi-pole auto-tuned parallel connected band-pass filter which is capable of automatically adjusting to the respective desired set values the center frequency and the band width of the multi-pole parallel connected band-pass filter with precision better than in the conventional embodiment.

A sixth object of the present invention is to provide a transmitter multiplexer, provided with a plurality of multi-pole auto-tuned parallel connected band-pass filters, which are capable of correctly effecting the above described tuning operation even when the signal to be reflected from another channel has been inputted into the automatic tuning type band-pass filter when, for example, the multi-pole auto-tuned parallel connected band-pass filter has been used in a transmitter multiplexer.

An auto-tuned apparatus for a band-pass filter of the first embodiment of the invention which is adapted to automatically set to the given frequency the center frequency of the band-pass filter capable of varying the center frequency, comprises a signal generating means for generating reference signals having the above described given frequency, a mixing means for mixing reference signals generated by the above described signal generating means with signals outputted from the above described band-pass filter, when the above described reference signals have been inputted to the above described band-pass filter, to effect multiplication for outputting the signals of the multiplied results, a low-pass wave filtering means for filtering the signals of a direct current component out of the signals of the multiplied results to be outputted from the above described mixing means, a control means for controlling the above described band-pass filter so that the center frequency of the above described band-pass filer may agree with the frequency of the above described reference signal in accordance with the signal of the direct current component to be outputted from the above described low-pass wave filtering means.

In an auto-tuned apparatus for a band-pass filter of the first embodiment of the invention constructed as described hereinabove, the above described signal generating means generates reference signals having the above described frequency. The above described mixing means mixes reference signals generated by the above described signal generating means with signals to be outputted from the above described band-pass filter when the above described reference signals have been inputted to the above described band-pass filter so as to multiply it for outputting the signals of the multiplied results. The above described low-pass wave filtering means filters the signals of the direct current component from the signals of the multiplied results to be outputted from the above described mixing means. The above described control means controls the above described band-pass filter so that the center frequency of the above described band-pass filter may agree with the frequency of the above described reference signal in accordance with the signal of the direct current component to be outputted from the above described low-pass filtering means.

When interference wave signals having the frequency component away sufficiently with respect to the frequency of the above described reference signal are inputted to the output terminal of the above described band-pass filter, the above described interference wave signal is directly inputted to the above described mixing means and is inputted to the above described mixing means through the input terminal from the output terminal of the above described band-pass filter. The interference wave signal passing through the above described band-pass filter of the latter passes through the band-pass filter having a attenuation amount large sufficiently with respect to the frequency component, thereafter is inputted to the above described mixing means, so that the level of the direct current component about the frequency component of the above described interference wave signal to appear in the output of the above described low-pass filtering means is considerably small, thus hardly influencing the above described auto-tuned operation. Therefore, the center frequency of the above described band-pass filter can be adjusted automatically to the desired set value with simple circuit construction and precision better than in the conventional embodiment.

The auto-tuned apparatus of the second embodiment of the invention comprises, in the auto-tuned apparatus described in the first invention, a first embodiment of the coupling means which is provided between the above described signal generating means and the input terminal of the above described band-pass filter, and between the above described signal generating means and the above described mixing means, outputs to the input terminal of the above described band-pass filter the reference signal to be generated by the above described signal generating means, and draws out a part of the above described reference signal to effect the output to the above described mixing means, a second coupling means which is provided between the output terminal of the above described band-pass filter and the output terminal of the above described auto-tuned apparatus, and between the output terminal of the above described band-pass filter and the above described mixing means, outputs to the output terminal of the above described auto-tuned means the signal to be outputted from the output terminal of the above described band-pass passing filter, and draws out a part of the signal to be outputted from the output terminal of the above described band-pass filter so as to output it to the above described mixing means.

The auto-tuned apparatus described in the second embodiment of the invention is desirably further provided with the above described first and second coupling means corresponding to directional couplers. The above described first coupling means outputs reference signals generated by the above described signal generating means to the input terminal of the above described band-pass filter and draws out a part of the above described reference signal to output it to the above described mixing means. The above described second coupling means outputs to the output terminal of the above described auto-tuned apparatus signals to be outputted from the output terminal of the above described band-pass filter and draws out a part of the signal to be outputted from the outer terminal of the above described band-pass filter to output it to the above described mixing means. By the above described coupling means, the interference wave signal to be inputted to the output terminal of the above described band-pass filter is prevented from being inputted by the above described mixing means through, for example, the above described second coupling means. By the above described first coupling means, the above described interference wave signal is prevented from being inputted to the above described mixing means through the above described band-pass filter and the above described first coupling means. Thus, if the interference wave signal is inputted, the center frequency of the above described band-pass filter can be automatically adjusted to the desired set value with precision.

An auto-tuned apparatus of the third embodiment of the invention is provided with an input means for inputting the center frequency to be set in the above described band-pass filter further in the auto-tuned apparatus of the first or second embodiment of the invention.

The auto-tuned apparatus of the third embodiment of the invention is further provided desirably with the above described inputting means corresponding to the keyboard. Thus, the center frequency to be set in the above described band-pass filter can be inputted with the use of the input means.

An auto-tuned apparatus of the fourth embodiment of the invention is provided with a receiving means for receiving from the external apparatus the information of the center frequency to be set in the above described band-pass filter further in the auto-tuned apparatus described in the first and second embodiments of the invention.

The auto-tuned apparatus of the fourth embodiment of the invention is further provided desirably with the above described receiving means corresponding to an interface circuit. Thus, information of the center frequency to be set in the above described band-pass filter can be received from the external apparatus.

An auto-tuned apparatus of the fifth embodiment of the invention is characterized in that in the auto-tuned apparatus described in the first, second, third or fourth inventions, the above described band-pass filter is provided as a resonator, the above described control means is adapted to calculate the resonance frequency of the above described resonator in accordance with the signal of the direct current component to be outputted from the above described low-pass wave filtering means so as to control the above described band-pass filter so that the center frequency of the above described band-pass filter may agree with the frequency of the above described reference signal in accordance with the above calculated resonance frequency.

In the auto-tuned apparatus of the fifth embodiment of the invention, desirably the above described band-pass filter is provided with a resonator. The above described control means calculates the resonance frequency of the above described resonator in accordance with the signal of the current component to be outputted from the above described low-pass filtering means, controls the above described band-pass filter so that the center frequency of the above described band-pass filter may agree with the frequency of the above described reference signal in accordance with the above-described calculated resonance frequency.

An auto-tuned apparatus of the sixth embodiment of the invention is characterized in that in the auto-tuned apparatus of the first, second, third or fourth embodiment of the inventions, the above described band-pass filter is provided with a resonator, the above described control means controls the above described signal generating means so that the frequency of the above described reference signal may agree with the center frequency of the above described band-pass filter in accordance with the signal of the direct current component to be outputted from the above described low-pass wave filtering means so as to change the frequency of the above described reference signal, controls the above describe band-pass filter so that the center frequency of the above described band-pass filter may agree with the frequency of the above described reference signal in accordance with the frequency of the changed reference signal.

In the auto-tuned apparatus of the sixth embodiment of the invention, desirably the above described band-pass filter is provided with a resonator, the above described control means controls the above described signal generating means so that the frequency of the above described reference signal may agree with the center frequency of the above described band-pass filter in accordance with the signal of the direct current component to be outputted from the above described low-pass filtering means so as to change the frequency of the above described reference signal, and controls the above described band-pass filter so that the cetner frequency of the above described band-pass filter may agree with the frequency of the above described reference signal in accordance with the frequency of the above described changed reference signal.

An automatic tuning type band-pass filter of the seventh embodiment of the invention comprises a band-pass filter capable of changing the center frequency, an auto-tuned apparatus described in the first, second, third, fourth, fifth, or sixth embodiment of the invention.

In the automatic tuning type band-pass filter of the seventh embodiment of the invention, a band-pass filter capable of changing the center frequency, the auto-tuned apparatus of the first, second, third, fourth, fifth or sixth inventions embodiment of the inventions are provided so as to construct an automatic tuning type band-pass filter.

An transmitter multiplexer of the eighth embodiment of the invention comprises a plurality of automatic tuning type band-pass filters of the eighth embodiment of the invention, an electric connection together with the output terminal of each of the above described automatic tuning type band-pass filters for outputting each signal to be outputted from each of the band-pass filters within each of the above described automatic tuning type band-pass filters.

In the antenna dependent of the eighth embodiment of the invention, a plurality of automatic tuning type band-pass filter of the seventh embodiment of the invention are provided with, the output terminal of each of the above described automatic tuning type band-pass filters which are adapted to output the respective signals to be outputted from each band-pass filter within each of the above described automatic tuning type band-pass filter are electrically connected together so that the above described auto-tuned operation can be effected without each of the above described automatic tuning type band-pass filter being influenced with the signals to be reflected from another channel.

An auto-tuned apparatus for the multi-pole parallel connected band-pass filter of the ninth embodiment of the invention in accordance with the present invention comprises a computing means for computing each center frequency to be set in each of the above described band-pass filter in accordance with the center frequency and the band width to be set in the multi-pole parallel connected band-pass filters where a plurality of band-pass filters each capable of changing the center frequencies has been electrically connected in parallel, a signal generating means for generating the respective reference signals each having a center frequency calculated by the above described computing means, a mixing means for respectively mixing the respective reference signals to be generated by the above described signal generating means with the respective reference signals to be outputted from the respective band-pass filters when each of the above described reference signals has been inputted respectively into each of the above described band-pass filters so as to do multiplication for outputting the respective signals of the multiplied results, a low-pass wave filtering means for filtering each signal of the direct current component from each signal of the multiplied results to be outputted from the above described mixing means, a control means for controlling the above described band-pass filters so that the center frequency of each of the above described band-pass filters may agree with the frequency of each of the above described reference signals in accordance with each signal of the direct current component to be outputted from the above described low-pass wave filtering means.

In the auto-tuned apparatus for the multi-pole parallel connected band-pass filter of the ninth embodiment of the invention, the above described computing means calculates each center frequency to be set in each of the above described band-pass filters in accordance with the center frequency and the band width to be set in the multi-poles parallel connected band-pass filter connected electrically in parallel with a plurality of band-pass filters each capable of changing the center frequency, thereafter the above described signal generating means generates each reference signal having each center frequency to be calculated by the above described computing means. The above described mixing means mixes each reference signal generated by the above described signal generating means with each signal to be outputted from each of the above described band-pass filters when each of the above described reference signals are respectively inputted to each of the above described band-pass filters to multiply it for outputting each signal of the multiplied results, the above described low-pass filtering means for filtering each signal of the direct component from each signal of the multiplied results to be outputted from the above described mixing means. The above described control means controls each of the above described band-pass filters so that the center frequency of each of the above described band-pass filters agrees with the frequency of each of the above described reference signals in accordance with each signal of the direct current component to be outputted from the above described low-pass filtering means.

When the interference wave signal having the frequency component away sufficiently with respect to the frequency of the above described reference signal is inputted to the output terminal of each of the above described band-pass filters, the above described interference wave signal is inputted directly to the above described mixing means and is inputted to the above described mixing means through the input terminal from the output terminal of each of the above described band-pass filters. But the interference wave signal passing through each of the band-pass filters of the latter passes through each of the band-pass filter having an attenuation amount sufficiently large with respect to the frequency component, thereafter is inputted to the above described mixing means. The level of the direct current component about the frequency component of the above described interference wave signal to appear to the output of the above described low-pass filtering means is considerably small, thus hardly influencing the above described auto-tuned operation. The center frequency and the band width of the above described multi-poles parallel connected band-pass filter can be respectively adjusted automatically to the desired set value with a simple circuit construction and precision better than in the conventional embodiment.

The auto-tuned apparatus of the tenth embodiment of the invention is characterized in that in an auto-tuned apparatus of the ninth embodiment of the invention, a first coupling means which is provided between the above described signal generating means and an input terminal of each of the above described band-pass filter and between the above described signal generating means and the above described mixing means, outputs to the input terminal of each of the above described band-pass filter the respective reference signals to be generated by the above described signal generating means, and draw out a part of each of the above described reference signal to effect the output to the above described mixing means, a second coupling means which is provided between the output terminal of the above described band-pass filter and the output terminal of the above described auto-tuned apparatus and between the output terminal of each of the above described band-pass filter and the above described mixing means, outputs to the output terminal of the above described auto-tuned means each signal to be outputted from the output terminal of each of the above described band-pass filters, and draws out a part of each signal to be outputted from the output terminal of each of the above described band-pass filter so as to output it to the above described mixing means.

The auto-tuned apparatus of the tenth embodiment of the invention is further provided desirably with the above described first, second coupling means corresponding to the directional couplers. The above described first coupling means outputs to an input terminal of each of the band-pass filters respectively each of the reference signals generated by the above described generating means, and draws out a part of each of the above described reference signals. The above described second coupling means outputs to the output terminal of the above described auto-tuned means each signal to be outputted from the output terminal of each of the band-pass filters, draws out a part of each signal to be outputted from the output terminal of each of the above described band-pass filters to output it to the above mixing means. By the above described second coupling means, the interference wave signal to be inputted to the output terminal of each of the above described band-pass filters through, for example, the above described second coupling means is prevented from being inputted to the above described mixing means. By the above described first coupling means, the above described interference wave signals can be prevented from being inputted to the above described mixing means through each of the above described band-pass filter and the above described first coupling means. Even when the interference wave signal is inputted, the center frequency of each of the above described band-pass filter can be automatically adjusted to the given set value even when the interference wave signal is inputted.

An auto-tuned apparatus of the eleventh embodiment of the invention is characterized in that an auto-tuned apparatus described in the ninth embodiment of the or tenth invention is further provided with an input means for inputting the center frequency and the band width to be set in the above described multi-pole parallel connected band-pass filter.

The auto-tuned apparatus of the eleventh embodiment of the invention is further provided desirably with the above described input means corresponding to a keyboard. The center frequency and the band width to be set in the above described multi-pole parallel connected band-pass filter can be inputted with the use of the input means.

An auto-tuned apparatus of the twelfth embodiment of the invention is characterized in that the auto-tuned apparatus described in the ninth or tenth embodiment of the invention is provided with a receiving means for receiving from an external apparatus the information of the center frequency and the band width to be set in the above described multi-pole parallel connected band-pass filter.

The auto-tuned means of the twelfth embodiment of the invention is further provided desirably with the above described receiving means corresponding to the interface circuit. The information of the center frequency and the band width to be set in the above described multi-pole parallel connected band-pass filter can be received from an external apparatus.

An auto-tuned apparatus of the thirteenth embodiment of the invention is characterized in that in the auto-tuned apparatus of the ninth, tenth, eleventh, or twelfth embodiment of the invention, each of the above described band-pass filters is respectively provided with a resonator, the above described control means respectively calculates each resonance frequency of each of the above described resonators in accordance with each signal of the direct current component to be outputted from the above described low-pass wave filtering means, controls each of the above described band-pass filers so that the center frequency of each of the above described band-pass filter may agree with the frequency of each of the above described reference signal respectively in accordance with each resonance frequency to be calculated.

In the auto-tuned apparatus of the thirteenth embodiment of the invention, desirably each of the above described band-pass filters is provided with a resonator. The above described control means calculates each resonance frequency of the above described respective resonators in accordance with each signal of the direct current component to be outputted from the above described low-pass filtering means, controls each of the above described band-pass filters so that the center frequency of each of the above described band-pass filter may agree with the frequency of each of the above described reference signals in accordance with each of the resonance frequencies calculated hereinabove.

An auto-tuned apparatus of the fourteenth embodiment of the invention is characterized in that in the auto-tuned apparatus of the ninth, tenth, eleventh or twelfth embodiment of the invention, each of the above described band-pass filters is respectively provided with a resonator, the above described control means controls the above described signal generating means so that the frequency of each of the above described reference signals may agree respectively with the center frequency of each of the above described band-pass filters so as to change of the frequency of each of the reference signals, controls each of the above described band-pass filters so that the center frequency of each of the band-pass filters may agree with the frequency of each of the above described reference signals in accordance with the frequency of each of the above described reference signals changed.

In the auto-tuned apparatus of the fourteenth embodiment of the invention, desirably each of the above described band-pass filters are respectively provided with a resonator. The above described control means controls the above described signal generating means so that the frequency of each of the above described reference signals may agree with the center frequency of each of the above described band-pass filters in accordance with each signal of the direct current component to be outputted from the above described low-pass filtering means so as to change the frequency of each of the above described reference signals, controls each of the above described band-pass filters so that the center frequency of each of the above described band-pass filters may agree with the frequency of each of the above described reference signals in accordance with the frequency of each of the above described changed reference signals.

A multi-pole auto-tuned parallel connected band-pass filter of the fifteenth embodiment of the is provided with multi-poles parallel connected band-pass filters where a plurality of band-pass filters capable of chaning the center frequencies are electrically connected in parallel, and an auto-tuned apparatus of the ninth, tenth, eleventh, thirteenth, or fourteenth embodiment of the invention.

In the multi-pole auto-tuned parallel connected band-pass filter of the fifteenth embodiment of the invention, a multi-pole parallel connected band-pass filter where a plurality of band-pass filters capable of changing the center frequency are connected electrically in parallel, and an auto-tuned apparatus of the ninth, tenth, eleventh, thirteenth or fourteenth embodiment of the invention.

An transmitter multiplexer of the sixteenth embodiment of the invention is provided with a plurality of multi-pole auto-tuned parallel connected band-pass filters described in the fifteenth embodiment of the invention, is electrically connected together with the output terminal of each of the above described multi-poles auto-tuned parallel connected band-pass filters so as to output each signal to be outputted from each band-pass filter within each of the above described multi-pole auto-tuned parallel connected band-pass filters.

In a transmitter multiplexer of the sixteenth embodiment of the invention a plurality of multi-pole auto-tuned parallel connected band-pass filters of the fifteenth embodiment of the invention are provided, the output terminal of each of the above described parallel multistage tuning type band-pass filters for outputting each signal to be outputted from each of the band-pass filters within each of the above described multi-poles auto-tuned parallel connected band-pass filters are together electrically connected so as to constitute a transmitter multiplexer capable of the above described auto-tuned operation without influences by the signals of interference wave to be reflected from another channel upon each of the above described multi-pole auto-tuned parallel connected band-pass filters.

BRIEF DESCRIPTION OF THE DRAWINGS

These and other objects and features of the present invention will become apparent from the following description of several preferred embodiments thereof, with reference to the accompanying drawings, in which.

DETAILED DESCRIPTION OF EMBODIMENTS OF THE INVENTION

Figure 1:
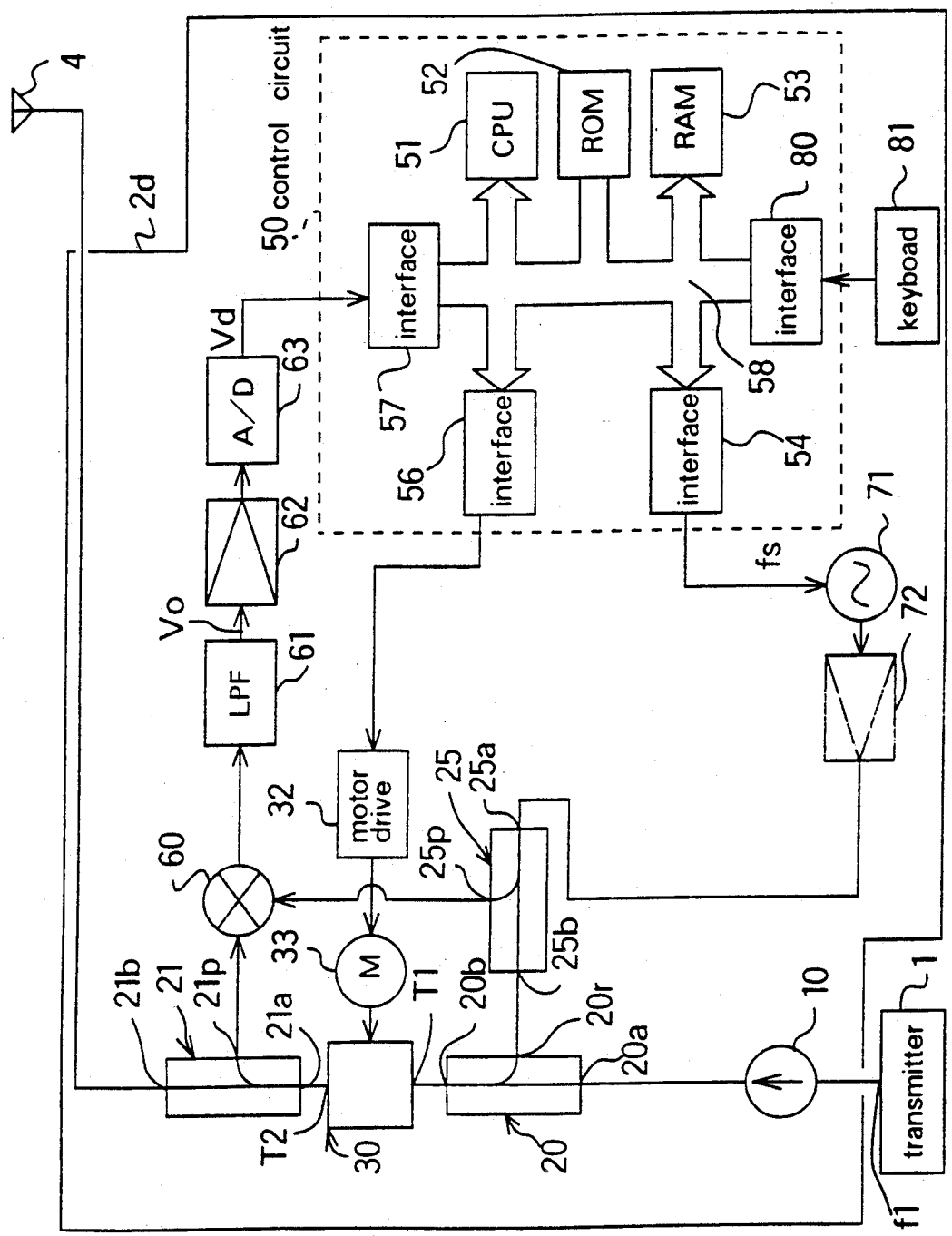
FIG. 1 is a block diagram of an auto tuned type band-pass filter in a first embodiment of the present invention.

Before the description of the present invention proceeds, it is to be noted that like parts are designated by like reference numerals throughout the accompanying drawings.

First Embodiment

FIG. 1 is a block diagram of an automatic tuning type band-pass filter 2d in a first embodiment of the present invention.

Figure 2:
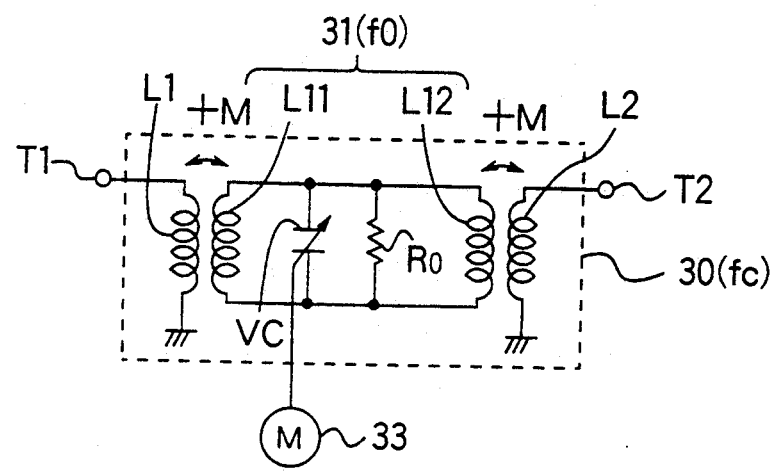
FIG. 2 is a circuit diagram showing an equivalent circuit of a band-pass filter constructed from a dielectric resonator of FIG. 1.

The automatic tuning type band-pass filter 2d is provided with a band-pass filter 30 including one dielectric resonator 31. (See FIG. 2.) Reference signals representative of a setting frequency fd are generated in the built-in signal generator 71 in accordance with the data representative of the center frequency (hereinafter referred to as the set frequency) fd to be set of the band-pass filter 30. The set frequency is inputted with the use of the keyboard 81, and the center frequency fc of the band-pass filter 30 may be made roughly to agree with, and tuned to, the above described center frequency fd in response ti the reference signal.

In the tuning operation of the band-pass filter 30 in the automatic tuning type band-pass filter 2d, the reference signal which is outputted from the above described signal generator 71 is made to pass through the band-pass filter 30. The signal after passing through the above described band-pass filter 30 is converted into a direct current component by a frequency converting circuit which comprises a mixer 60 and a low-pass filter 61 through which only the given low frequency component is made to pass. The reference signal outputted from the above described signal generator 71 is used as a local oscillation signal. The stepping motor 33 for varying the variable capacitance VC of the dielectric resonator 31 within the band-pass filter 30 is driven so that the level of the signal of the above described direct current component remains roughly 0 in accordance with the converted direct current component, namely, the center frequency fc of the band-pass filter 30 may roughly agree with the frequency fd of the above described reference signal.

As shown in FIG. 1, for example, a transmission signal of a frequency f1 in a UHF band is outputted from a transmitter 1 and has a predetermined constant level. The transmission signal is outputted to an antenna 4 through an automatic tuning type band-pass filter 2d in the present embodiment, which is used in this case as a transmission band-pass filter, so as to radiate the above described transmission signals from the antenna 4. In the automatic tuning type band-pass filter 2d, the signal to be outputted from the transmitter 1 is inputted to the input terminal 20a of the directional coupler 20 through an isolator 10. The directional coupler 20 is provided with a transmission line for transmitting the above-described distributed transmission signals, and a coupling line for compounding reference signals provided on the side of the output terminal 20b of the transmission line of the directional coupler 20 away by given interval from the above described transmission line so that the transmission signal transmission coupled electro-magnetically to the transmission line and the reference signal to be inputted to an input terminal 20r of the coupling line may be compounded. The signal outputted from the output terminal 20b of the transmission line of the directional coupler 20 is inputted to the input terminal T1 of the band-pass filer 30. The signal outputted from the output terminal T2 after passing through the band-pass filter 30 is outputted to an antenna 4 through the input terminal 21a and the output terminal 21b of the transmission line of the directional coupler 21. The directional coupler 21 is provided with a transmission line for transmitting the signal after passing the band-pass filter 30 and a coupling line for detecting transmission signals provided on the side of the input terminal 21a of the directional coupler 21 away by a given interval from the transmission line so that a part of the power of the transmission signal transmission coupled electromagnetically to the transmission line is branched, drawn out. The coupling line for detecting the transmission signal is provided with an output terminal 21p. The signal outputted from the output terminal 21p of the coupling line is inputted to the main signal input terminal of the mixer 60 and will be referred to as a main signal.

The band-pass filter 30 is provided with a dielectric resonator 31 and has a variable center frequency fc. The dielectric resonator 31 within the band-pass filter 30 is, as shown in an equivalent circuit of FIG. 2, a combination of two inductances L11, L12 and a variable capacitance VC and a loss resistance Ro connected in parallel. The inductance L11 is electromagnetically coupled to an input side coil L1 of the band-pass filter 30 with a induction coupling +M. The inductance L12 is electromagnetically coupled to an output side coil L2 of band-pass filter 30 with an induction coupling +M. One end of the input side coil L1 is connected with the input terminal T1. The other terminal is connected with an earth line. One end of the output side coil L2 is connected with the output terminal T2, and the other end thereof is connected with the earth line. Further, the electrostatic capacity of the capacitance VC is varied by a stepping motor 33 which is controlled by a motor driving circuit 32 by a control circuit 50 as described later in detail.

Figure 3:
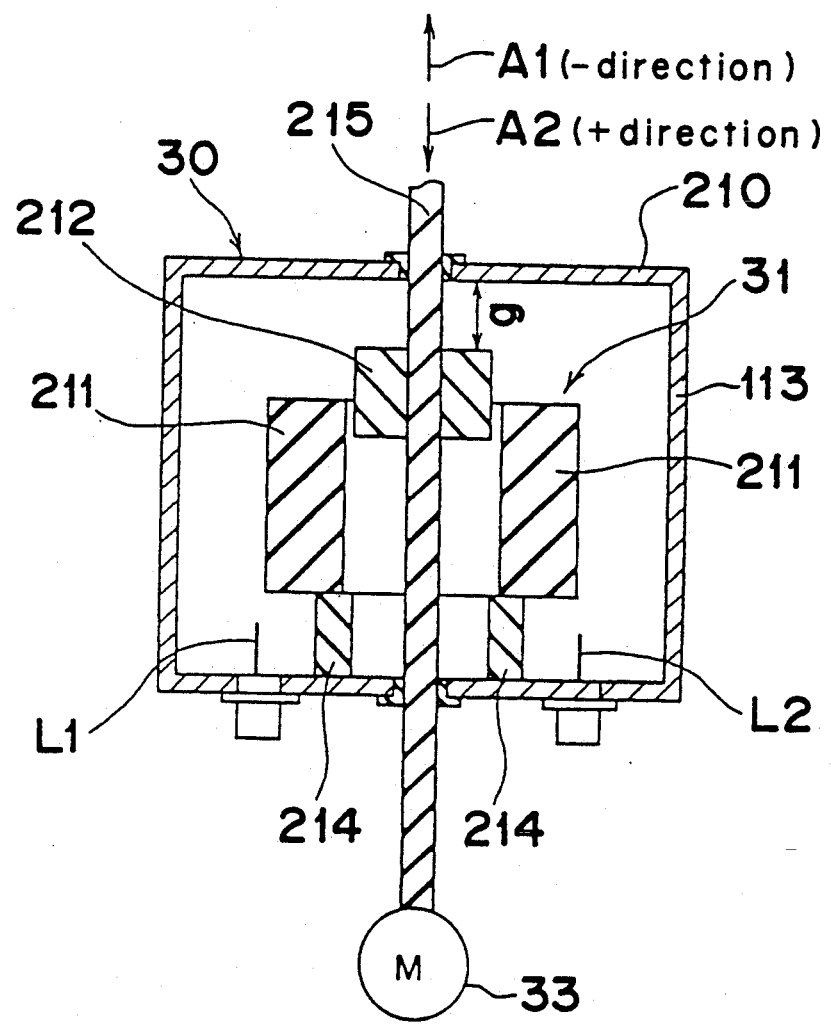
FIG. 3 is a sectional view of a band-pass filter of FIG. 2.

FIG. 3 shows a sectional view of each band-pass filter 30 provided with a dielectric resonator 31. As shown in FIG. 3, a cylindrically shaped dielectric resonator 211 is placed on a support stand having the same coefficient of linear expansion as that of the dielectric resonator 211 in the center portion within the cylindrically shaped shield case 210. The dielectric resonator 211 is a ceramic dielectric resonator mixed with ZrSn with, for example, TiO2 being provided as principal component. The dielectric resonator 31 in the present embodiment has a resonance frequency fo of approximately 886.4 MHz and the TEo1δ mode is the dominant mode. A cylinder shaped dielectric tuning element 212 is supported, provided by a shaft 215 within the cylinder of the dielectric resonator 211. The shaft 215 is moved by a stepping motor 33 in − direction of an arrow mark A1 and + direction of an arrow mark A2 of the opposite direction by the stepping motor 33. The above described dielectric tuning element 212 is moved in the grade of the electric field of the dielectric resonator 211 so that the resonance frequency of the dielectric resonator 211 is finely adjusted.

Figure 4:
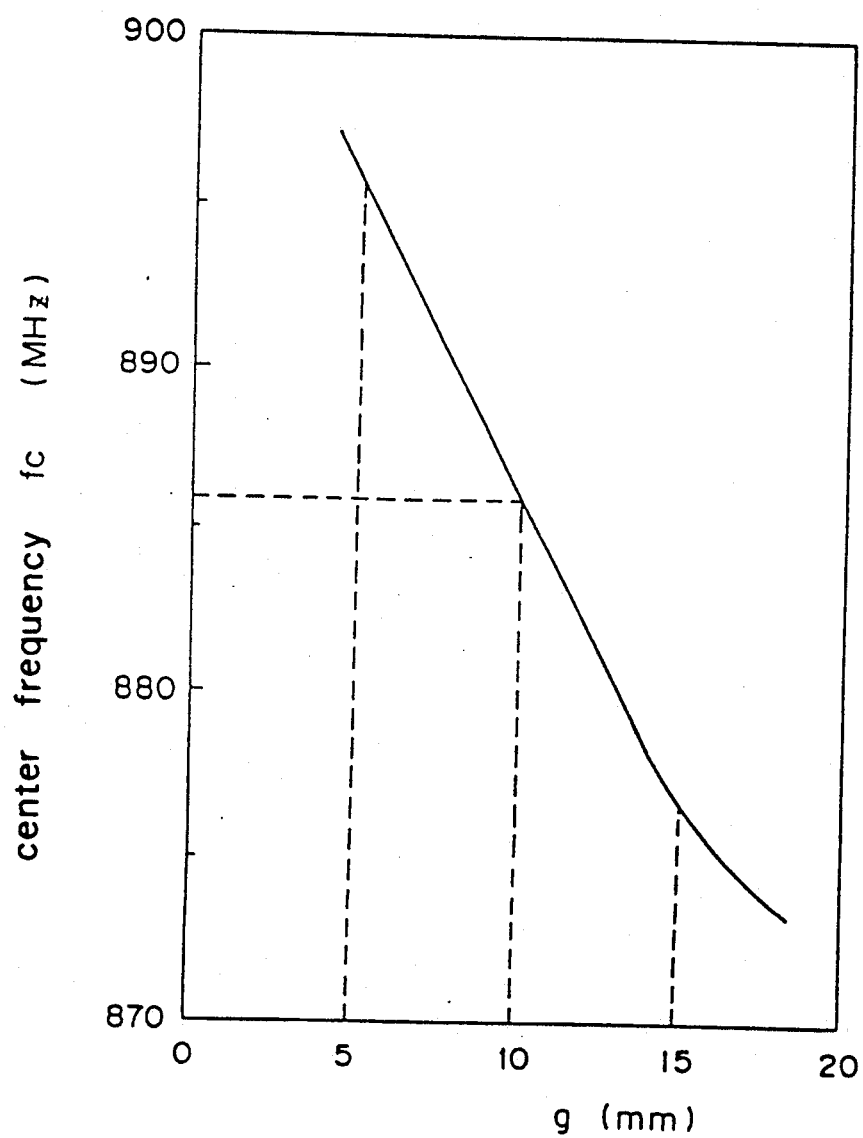
FIG. 4 is a graph showing the relationship between the position of a dielectric tuning element of and a center frequency of the band-pass filter of FIG. 3.

FIG. 4 shows a graph showing the relationship between the position of the dielectric tuning element 212 of the band-pass filter 30 of FIG. 3 and the center frequency fc of the band-pass filter 30 approximately equal to the resonance frequency fo of the dielectric resonator 31. The g is an interval from the top face of the dielectric tuning element 212 to the top face inner side of the shield case 210. As shown clearly from FIG. 4, the dielectric tuning element 212 is separated from the top face of the shield case 210, namely, the interval g is increased so that the resonance frequency of the above described dielectric resonator 31 changes in approximately inverse proportion relation to the interval g.

In FIG. 3, the above described shield case 210 has a silver electrode baked for electromagnetic shielding operation on the external surfaces of a cylindrically shaped housing made of ceramic having the same coefficient of linear expansion as that of the dielectric resonator 211. For example, the input side coil L1 and the output side coil L2 are respectively provided so as to couple the magnetic field of the dielectric resonator 211, as shown in FIG. 3 respectively in two positions away from each other around the center of the cylinder on the under face of the shield case 210 and immediately under the cylindrically external side edge end portion of the above described dielectric resonator 211.

Figure 5:
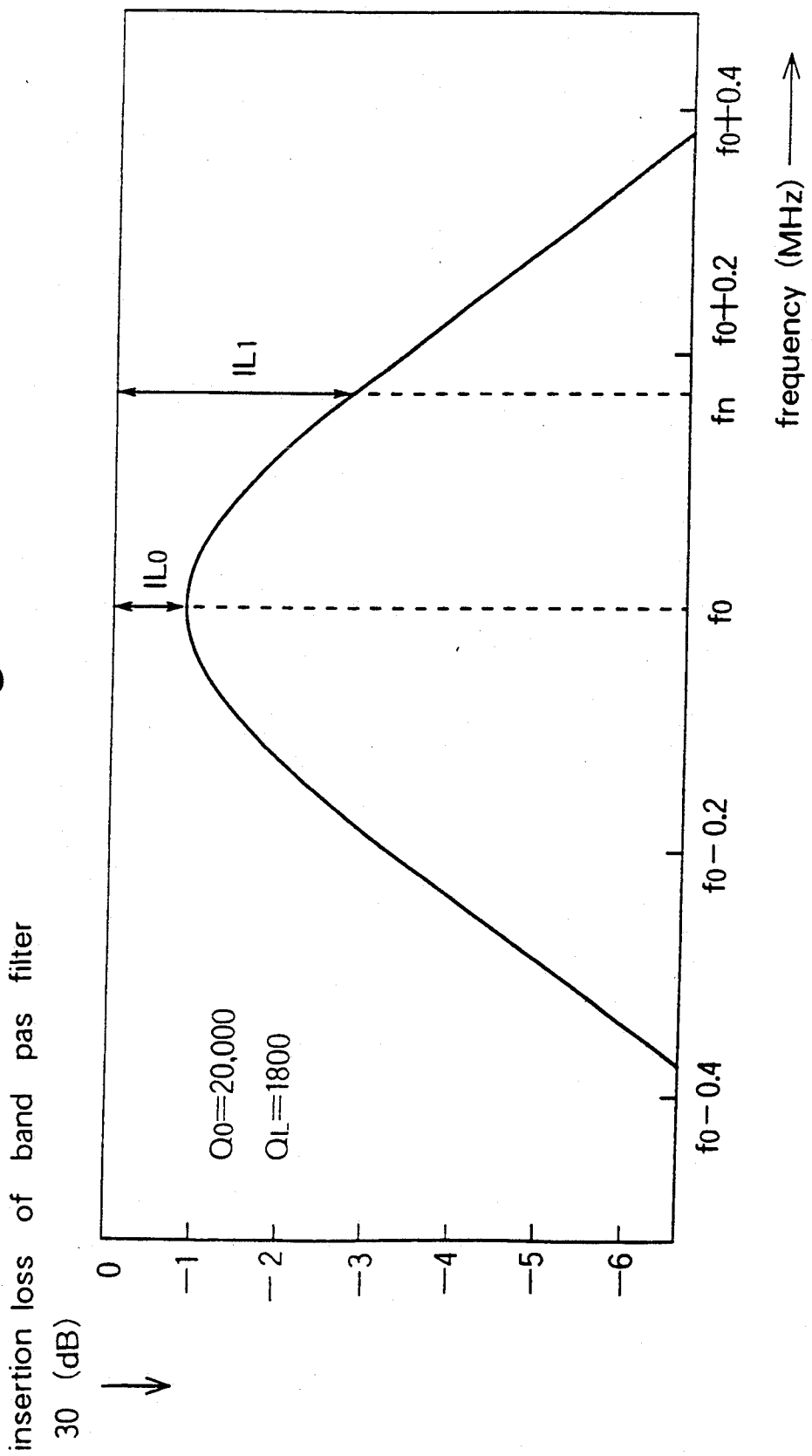
FIG. 5 is a graph showing the frequency characteristics with respect to the insertion loss of the band-pass filter of FIG. 3.

FIG. 5 is a graph showing the frequency characteristics of the insertion loss of the band-pass filter 30 when the signal has been inputted to the input terminal T1 of the band-pass filter 30 in a case where the output terminal T2 of the band-pass filter 30 of FIG. 3 has been terminated in the terminal resistor having the given impedance. Here unloaded Q (Qo) of the dielectric resonator 31 within the band-pass filter 30 is 20,000 and the loaded Q ($Q_L$) is 1,800. As clear from FIG. 5, the insertion loss of the band-pass filter 30 becomes minimum in the resonance frequency of of the dielectric resonator 31.

Generally in the band-pass filter 30 having a loaded Q ($Q_L$), combined of a resonator, the transmission phase $Q_R$ of the band-pass filter 30 in the frequency fn away by frequency Δf from the resonance frequency fo and adjacent to the resonance frequency fo is expressed in the following equation 1, wherein the condition is Δf<<fo.

$$\theta_R = \tan^{-1}\left\{ Q_L \left( \frac{fn}{fo} - \frac{fo}{fn} \right) \right\} \quad (1)$$

The difference between the insertion loss ILo [dB] of the band-pass filter 30 in the resonance frequency fo and the insertion loss IL1 [dB] of the band-pass filter 30 in a frequency fn of the resonance frequency fo is expressed in the following equation 2.

$$IL_1 - IL_0 = 10 \cdot \log\left\{ 1 + Q_L\left( \frac{fn}{fo} - \frac{fo}{fn} \right) \right\} \quad (2)$$

Therefore, the following equation 3 is obtained from the equation 1 and the equation 2.

$$IL_1 - IL_0 = 10 \cdot \log(1 + \tan^2\theta_R) \quad (3)$$

The resonance frequency fo from the equation 1 is expressed in the following equation 4.

$$fo = \frac{-F_1 + \sqrt{F_1^2 + 4}}{2} \cdot fn \quad (4)$$

Here the constant F1 of no-dimension is expressed in the following equation 5.

$$F_1 = \frac{\tan\theta_R}{Q_L} \quad (5)$$

The circuit of the signal processing system and the control system within the automatic tuning type band-pass filter 2d will be described with reference to FIG. 1.

As shown in FIG. 1, a signal generator 71 is a signal generator which includes a PLL circuit and can change the frequency of the reference signal to be caused, generates the reference signal of the above described setting frequency fs so as to output it to the input terminal 25a of the directional coupler 25 in accordance with the data of the setting frequency fs to be inputted through the interface circuit 54 from the CPU51 of the control circuit 50. The directional coupler 25 is provided with a transmission line for transmission reference signals to be inputted to the input terminal 25a through an amplifier 72 from the signal generator 71, and a coupling line for detecting the reference signals provided away by the given interval from the transmission line and on the side of the input terminal 25a of the directional coupler 25 so that a part of the power of the transmittion reference signals coupled electromagnetically to the transmission line may be branched, drawn out so as to detect the above described reference signal, the coupling line for detecting the reference signals is provided with an output terminal 25p. The reference signal to be outputted from the output terminal 25b of the transmission line of the directional coupler 25 is inputted to the input terminal T1 of the band-pass filter 30a through the input terminal 20r of the coupling line of the directional coupler 20 and the output terminal 20b of the transmission line. The reference signal to be outputted from the output terminal 25p of the coupling line of the directional coupler 25 is inputted to the local oscillation signal inputting terminal of the mixer 60 as a first local oscillating signal.

A mixer combined of a multiplier mixes signals to be inputted to the main signal inputting terminal with signals to be inputted to the local oscillation signal inputting to terminal to multiply them and outputs the signals mixed to the low-pass passing filter (LPF) 61. When the outputs of the transmission signals from the transmitter 1 have been stopped, the mixed signals to be outputted from the mixer 60 and mixed contain the frequency component of fs +fs and fs−fs (direct current component). The low-pass passing filter 61 lets only the direct current component pass from the mixed signals inputted. Thereafter, the signals of the direct current component is outputted to the analog/digital conversion (hereinafter referred to as A/D conversion) circuit 63 through an amplifier 62. Then, the A/D converting circuit 63 converts the analog signal of the above described direct current component into the digital signal Vd so as to output it into a CPU 51 through an interface circuit 57 within the control circuit 50.

A voltage Vo of the direct current component to be outputted from the low-pass passing filter 61 is expressed in the following equation 6, where the voltage of a main signal to be inputted to the mixer 60 from the directional coupler 21 is $V_M$, a voltage of the local oscillating signal to be inputted to the mixer 60 from the directional coupler is $V_L$, and a phase difference of each signal to be inputted to the mixer 60 is $\Delta\theta$.

$$V_o = a_{60} V_m V_l \sin\Delta\theta \qquad (6)$$

Here, a60 is an apparatus constant to be decided by a multiplication coefficient of the mixer 60 and the insertion loss in the direct current of the low-pass passing filter 61.

A transmission line for main signal use to the main signal input terminal of the mixer 60, passing the directional coupler 25 and the output terminal 25b of the transmission line from the above described reference point, with the input terminal 25a of the directional coupler 25 as a reference point, the input terminal 20r of the coupling line of the directional coupler 20 and the output terminal 20b of the transmission line, the band-pass filter 30, and the input terminal 21a of the directional coupler 21 and the output terminal 21p of the coupling line is made a first transmission line. The transmission line for local oscillation signal use to the local oscillation signal input terminal of the mixer 60a through the coupling line of the directional coupler 25 and the output terminal 25p from the above described reference point is made a second transmission line. The transmission phase θ1a (but except for the transmission phase $\theta_R$ of the band-pass filter 30 of the above described first transmission line and the transmission phase θ2a in the second transmission line in an optical frequency fa near the resonance frequency of fo the dielectric resonator 31 desirably within the band-pass filter 30 are measured in advance.

When the resonance frequency fo of the dielectric resonator 31 within the above described band-pass filter 30 is set at a certain set frequency fss, the transmission phase of the above described first transmission line except for the transmission phase $\theta_R$ of the band-pass filter 30 is made θ1, and the transmission phase of the above described second transmission line is made θ2 in the set frequency fss, the phase difference $\Delta\theta$ of each signal to be inputted to the mixer 60a is expressed in the following equation 7.

$$\begin{aligned}\Delta\theta &= (\theta_1 + \theta_R) - \theta_2 \\ &= (\theta_{1a} - \theta_{2a})\frac{fss}{fa} + \theta_R\end{aligned} \qquad (7)$$

In the present embodiment, in the set frequency fss to be set of the resonance frequency fo of the dielectric resonator 31 within the above described band-pass filter 30, the delay circuit (not shown) is inserted in advance into the above described first or second transmission line so that the phase difference $\Delta\theta$ of each signal to be inputted to the mixer 60 becomes $2n\pi + \pi/2$ [rad] (wherein $\pi$ is an integer), desirably $\pi/2$ [rad].

Assume that the signal level of the reference signal to be inputted to the input terminal 25a of the directional coupler 25 is Sr [dBm] in a certain frequency fss, the signal level $S_M$ [dBm] of the main signal to be inputted respectively to the mixer 60 and the signal level $S_L$ [dBm] of the local oscillation signal become respectively the next equation 8 and equation 9. In the equation 8 and the equation 9, the loss of each transmission line for connecting each element is neglected.

$$S_M = S_r - L_{25t} - L_{20r} - IL_1 - L_{21p} = a_{601} \cdot \log V_M \qquad (8)$$

$$S_L = S_4 L_{25p} = a_{602} \cdot \log V_L \qquad (9)$$

Here L25t is an insertion loss [dB] of the directional coupler 25 to be measured in advance. L20r is a composite loss [dB] of the directional coupler 20 to be measured in advance, L21p is a branch loss [dB] of a directional coupler 21 to be measured in advance, L25p is a branch loss [dB] of the directional coupler 25 to be measured in advance. a601 and a602 are respectively constants to be determined in advance.

As clear from the equation 8 and the equation 9, the signal level $S_M$ of the main signal is determined depending upon the insertion loss IL1 of the band-pass filter 30 in the set frequency fss with respect to the signal level Sr of the reference signal, while the signal level $s_L$ of the local oscillation signal is determined in advance with respect to the signal level Sr of the reference signal.

As clear from the equation 6, the equation 8 and the equation 9, the voltage Vo of the direct current component to be outputted from the low-pass passing filter 61 is determined depending upon the insertion loss IL1 of the band-pass filter 30 in the set frequency fss, the phase difference $\Delta\theta$ of each signal to be inputted to the mixer 60. Namely, as shown in the next equation 10, the voltage Vo of the direction current component is expressed with the insertion loss IL1 of the band-pass filter 30 in the set frequency fss and a function about the phase difference $\Delta\theta$ of each signal to be inputted to the mixer 60.

$$V_o = f(IL_1, 66\ \theta) \qquad (10)$$

In the present embodiment, the transmission signal to be outputted from the transmitter 1 is not inputted to the automatic tuning type band-pass filter 2d. The reference signal of, for example, the set frequency fss is generated in the signal generator 71 with the input terminal of the isolator 10 being terminated with the terminal resistor having the given impedance. At this time, the voltage Vo of the direct current component to be outputted from the low-pass passing filter 61 is measured and the voltage Vo measured is substituted into the equation 10. Thereafter, the ternary simultaneous equations of the above described equation 3, the equation 7 and the equation 10 are solved. Thus, the transmission phase $\theta_R$, the insertion loss IL1, the phase difference $\Delta\theta$ of the band-pass filter 30 in the set frequency fss to be set of the center frequency of the band-pass filter 30 are calculated. Then, the calculated transmission phase $\theta_R$ is substituted to the equation 5 so as to compute a constant F1, further the calculated constant F1 is substituted into the equation 4 so as to calculate the resonance fo. The moving distance 1m for moving the dielectric tuning element 212 is calculated with the use of the next equation 11 in accordance with the calculated resonance frequency fo and the set frequency fss.

$$1m = k (f_0 - f_{ss}) \quad (11)$$

Here k is a constant to be determined from the graph of the above described FIG. 4. The pulse driving signal of the pulse number corresponding to the moving distance 1m calculated is inputted to the stepping motor 33 so as to move the dielectric tuning element 212 within the band-pass filter 30. The tuning processing about the band-pass filter 30 can be effected so that the center frequency fc of the band-pass filer 30 may roughly agree with the above described set frequency fss.

As shown in FIG. 1, the control circuit 50 within the automatic tuning type band-pass filter 2d is provided with a CPU51 for effecting the above described tuning processing of the band-pass filter 30 to control the dielectric resonator 31 within the band-pass filter 30, a ROM52 for accommodating in advance the data (for example, the loaded Q ($Q_L$) or the like of the dielectric resonator 31 within the band-pass filer 30) for carrying out the control program of each of the above described tuning processing and the control program, a RAM53 to be used as the working area of the CPU51 for accommodating the data to be inputted through each of the interface circuits 57, 80. The control circuit 50 is further provided with an interface circuit 54 to be connected with the signal generator 71, an interface circuit 56 to be connected with the stepping motor 33 respectively through the motor driving circuit 32, an interface circuit 57 to be connected with the A/D converting circuit 63, and an interface circuit 80 to be connected with a keyboard 81. The CPU51, the ROM52, the RAM53, the respective interface circuits 54, 56, 57, 80 are connected with a bus 58 within the control circuit 50.

When the CPU51 effects the tuning processing of the band-pass filter 30, the data of the set frequency fd are inputted by an operator with the use of the keyboard 81 in the automatic tuning type band-pass filter 2d as described later in detail. In the present embodiment, the processing for taking in into the RAM53 through the interface circuit 80 from the keyboard 81 the data of the set frequency fd in the automatic tuning type band-pass filter 2d is effected with the offering processing of the CPU51.

The CPU51 generates the reference signals of the frequency fs equal to the set frequency fd in the signal generator 71, thereafter the tuning processing for roughly making the resonance frequency fo of the dielectric resonator 31 within the band-pass filter 30 to agree with the frequency fs of the above described reference signal. Namely, in the tuning processing, the motor driving signal for driving the stepping motor 33 is outputted to the stepping motor 33 through the interface circuit 56 and the motor driving circuit 32 so as to effect the driving operation so that the level of the signal of the above described direct current component to be inputted to the CPU51 through the interface circuit 57 from the A/D converting circuit 63 may become roughly 0. When the motor driving signal of the pulse of + polarity is inputted to the stepping motor 33, the dielectric tuning element 212 within the band-pass filter 30 is moved in the direction of the arrow A2 as shown in FIG. 3. When the motor driving signal of the pulse of the − polarity is inputted to the stepping motor 33, the dielectric tuning element 212 within the band-pass filter 30 is moved in the direction an arrow A1. The electrostatic capacity of the variable capacitance VC in the equivalent circuit of FIG. 2 changes to vary the resonance frequency fo of the dielectric resonance 31, so that the center frequency fc of the band-pass filter 30 roughly equal to the resonance frequency fo can be changed. In the present embodiment, the control circuit 50 drives the stepping motor 33 so that the level of the direct current component to be outputted from the low-pass passing filter 61 may become 0 so as to vary the resonance frequency of the dielectric resonator 31 within the band-pass filter 30. The center frequency fc of the band-pass filter 30 roughly equal to the resonance frequency fo can be made to roughly agree with the frequency fs of the reference signal to be generated by the signal generator 71. The tuning processing is carried out so that the center frequency of the automatic tuning type band-pass filter 2d can be automatically set to the above described set frequency inputted with the use of the keyboard 81.

Figure 6:
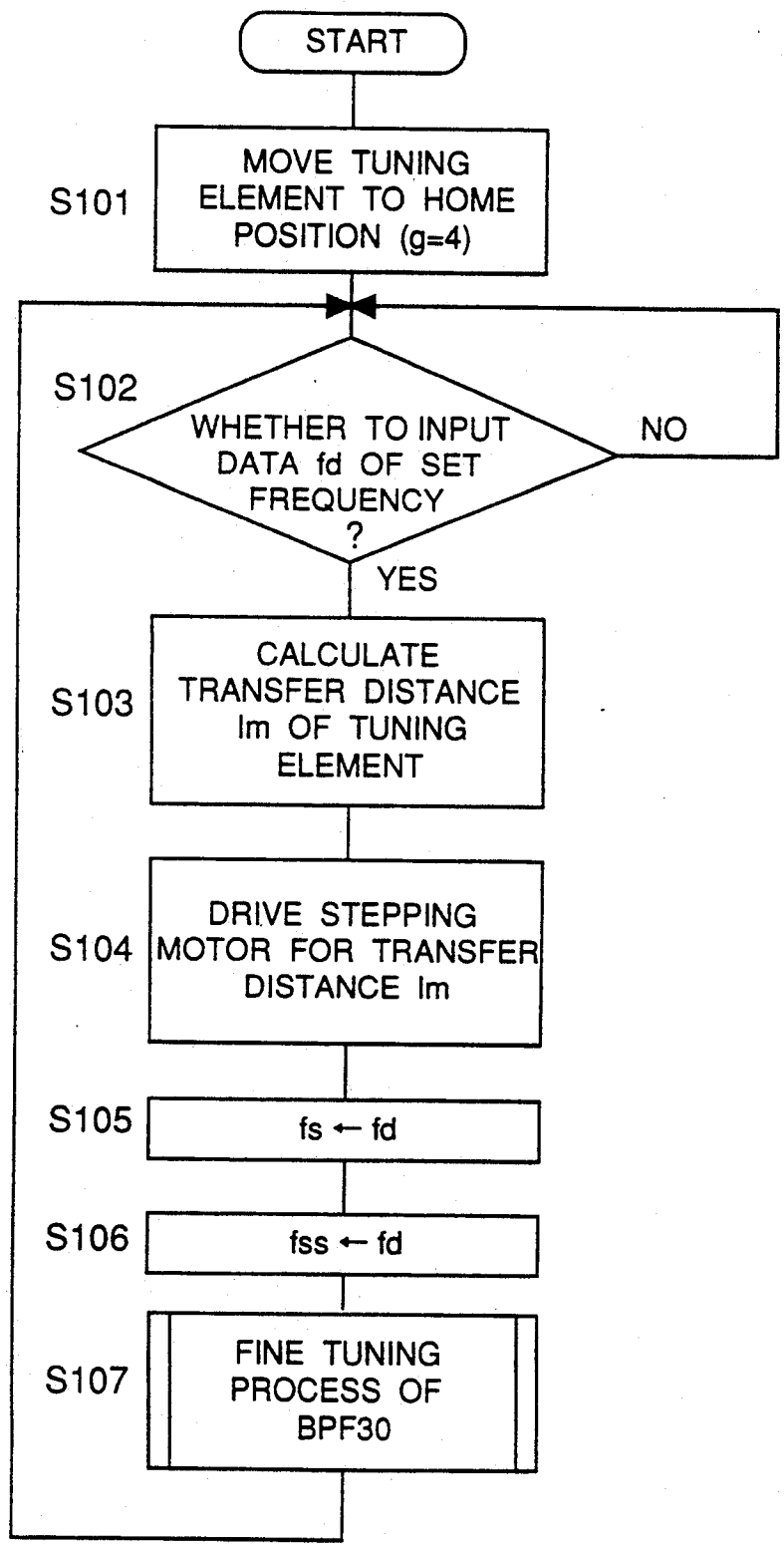
FIG. 6 is a flow chart showing a main routine of the control flow of the control circuit of the automatic tuning type band-pass filter of FIG. 1.

FIG. 6 is a flow chart showing the main routine of the tuning processing of the control circuit 50 of the automatic tuning type band-pass filter 2d of FIG. 1. The main routine processes the above described tuning processing, and is a processing operation for automatically setting, into the set frequency fd inputted with the use of the keyboard 81, the center frequency fc of the band-pass filter 30. In the initial condition before the start of the main routine, the dielectric tuning element 212 of the dielectric resonator 31 within the band-pass filter 30 is positioned in the optional distance g. In the main routine, the processing of the step S103 and the step S104 is a rough tuning processing operation for respectively changing the center frequency fc of the band-pass filter 30 built in into the frequency near the set frequency fd. The processing operation from the step S105 to the step S107 is a fine tuning processing which changes the center frequency fc of the band-pass filter 30 built in from the frequency near the above described frequency fd after the above described rough tuning processing operation so as to roughly agree with the above described set frequency fd.

When the power switch (not shown) of the control circuit 50 is turned on, the main routine of the tuning processing of FIG. 6 is started. In the step S101, the dielectric tuning element 212 within the band-pass filter 30 is moved to a position (hereinafter referred to a home position) of g=4 [mm] by the driving of the stepping motor 33. In the present embodiment, a stopper (not shown) for the dielectric tuning element use is provided within each band-pass filter 30 so that the dielectric tuning element 212 within the band-pass filter 30 may not be moved in the direction of an arrow A1 from the above described home position. In the step S101, when the motor driving signal of the − polarity of pulse is inputted continuously to the stepping motor 33 and each dielectric tuning element 212 is stopped in the home position by the above described stopper, a microswitch (not shown) provided in the home position is turned on and at this time, the driving operation of each stepping motor 33 is stopped. Each resonance frequency fo of each dielectric resonator 31 within the band-pass filter 30 in the home position is 897 [MHz] as shown in FIG. 4 measured in advance, with the data being accommodated in the RAM53.

In the step S102, whether or not the data of the set frequency fd has been inputted is judged in the automatic tuning type band-pass filter 2d with the use of the keyboard 81. When the data has not been inputted (NO in the step S102), the loop processing of the step S102 is repeated into a waiting condition. When the data has been inputted (YES in the step S102), the step moves to a step S103. In the step S103, as the rough tuning processing is effected, the moving distance 1m to move the dielectric tuning element 212 within the band-pass filter 30 is calculated by the use of the equation 11 in accordance with the data of the resonance frequency fo accommodated in the RAM53 and the data of the set frequency fd (=fss) to be set. In the step S104, the pulse driving signals of the pulse number corresponding to the calculated moving distance 1m are respectively inputted to the stepping motor 33 so as to move the dielectric tuning element 212 within the band-pass filter 30 is moved. When the moving distance 1m is positive, the pulse driving signal of + polarity is respectively inputted to the stepping motor 33. The dielectric tuning element 212 is moved in the direction of arrow A2 by the moving distance 1m. When the moving distance 1m is negative, the pulse driving signal of − polarity is respectively inputted to the stepping motor 33. The dielectric tuning element 212 is moved in the direction of an arrow A1 by the moving distance 1m. The rough adjusting is completed.

In order to effect the fine tuning processing, the data of the set frequency fd in the step S105 is outputted as the set frequency fs to the signal generator 71 so as to generate the reference signal of the set frequency fs to the signal generator 71. Thereafter, in the step S106, the data of the set frequency fd is accommodated in the RAM53 as the set frequency fss. In the step S107, the center frequency fc of the band-pass filter 30 to be built in is changed from the frequency near the above described frequency fd after the above described rough tuning processing operation so as to execute the fine tuning processing operation (see FIG. 7 and FIG. 8 through FIG. 11) for roughly agreeing with the above described set frequency fd, and thereafter, the step is restored to the step S102. Hereinafter, the above described rough tuning processing and the above described fine tuning processing are repeated, by the use of the keyboard 81, every time the set frequency of the automatic tuning type band-pass filter 2d is newly inputted.

Figure 7:
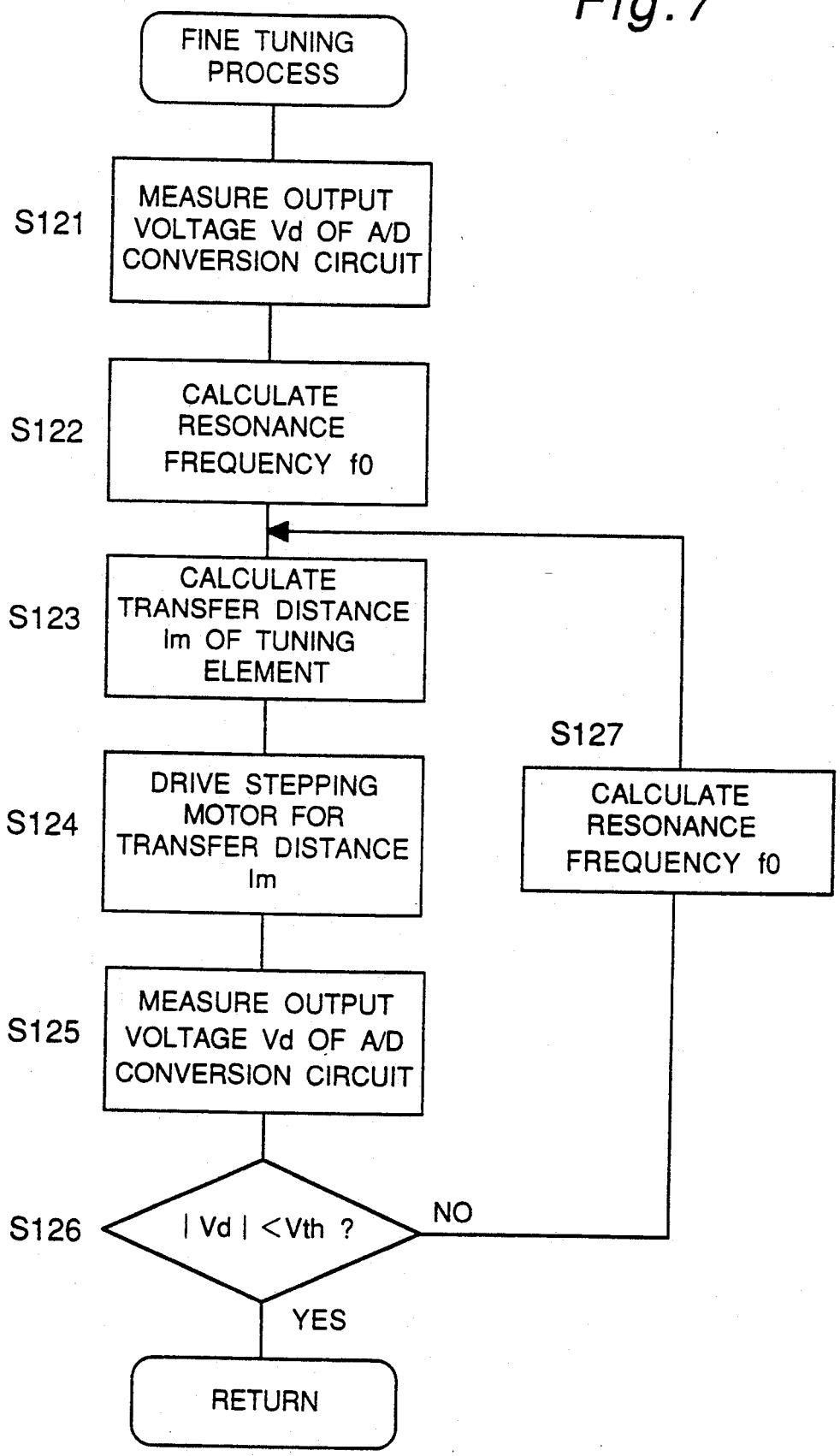
FIG. 7 is a flow chart showing a subroutine of the fine tuning processing of FIG. 6.

In FIG. 7, the floating chart of the subroutine of the fine tuning processing step S107, the steps S10, S14 to be described later) of FIG. 6 is shown.

As shown in FIG. 7, the output voltage data Vd to be inputted from the A/D converting circuit 63 is taken in in the step S121, is converted into the output voltage Vo of the low-pass passing filter 61, is accommodated into the RAM53. Thereafter, in the step S122, the resonance frequency fo is calculated with the use of the equation 3, the equation 7, the equation 10 and the equation 4, the equation 5 as described hereinabove in accordance with the above-described converted output voltage Vo.

The moving distance 1m for moving the dielectric tuning element 212 with the use of the equation 11 has been calculated in accordance with the above-described calculated resonance frequency fo and the set frequency fss established in the previous step in the step 123. Thereafter, in the step S124, the pulse driving signal of the pulse number corresponding to the above-described calculated moving distance 1m in the step S124 is inputted to the stepping motor 33 so as to move the dielectric tuning element 212. In the step S125, the output voltage data Vd to be inputted from the A/D converting circuit 63 is taken in, is converted to the output voltage Vo of the low-pass passing filter 61, is accommodated into the RAM53 as the data Vd. Thereafter, in the step S126, it is judged whether or not an absolute value $|Vd|$ is a threshold value voltage Vth, which is a positive number considerably near 0 for judgment of having approximately tuned. When the absolute value $|Vd|$ of the output voltage data is smaller than the threshold value voltage Vth (YES in the step S126), the fine tuning processing is considered to have completed and the original main routine returns. When the absolute value of the output voltage data is larger (NO in the step 126), the fine tuning processing operation is further is effected. In the step S127, the resonance frequency fo is calculated as in the above described step S122 in accordance with the output voltage data Vo measured, converted in the previous step S125. Thereafter, the step is restored to the step S123. Until the absolute value $|Vd|$ of the output voltage data becomes smaller than the threshold value voltage Vth, namely, until the center frequency fc of the band-pass filter 30 approximately agrees with the set frequency fd, the processing operation of the loop is executed.

In the automatic tuning type band-pass filter 2d constructed as in FIG. 1, the directional couplers 21, 25 are provided even when the interference wave signal adjacent to the frequency f1 from the other radio system and so on through the antenna 4 is inputted, the frequency component to turn round from the interference other channel is not inputted to the mixers 60a, 60b as the directional couplers 21, 25 are provided. Therefore, the above described tuning processing operation can be effected without influences upon the frequency component of the interference wave signal as in the conventional embodiment.

Even where a divider or the like, instead of the directional couplers 21, 25, to which reflection signals are outputted, when the frequency of the above described interference wave signal is away sufficiently with respect to the frequency f1 of the transmission signal to be outputted from the transmitter 1, the above described interference wave signal is inputted to the local oscillation signal input terminal of the mixer 60 after the interference wave signal has passed through the band-pass filter 30 having an attenuation amount sufficiently large with respect to the frequency component. The level of the direct component about the frequency component of the above described interference wave signal, appearing in the output of the low-pass passing filter 61, is considerably small, thus hardly giving influences upon the above described tuning processing. The above described tuning processing can be effected without influences upon the frequency component of the interference wave signal as in the conventional embodiment.

A flow chart in a modified embodiment of a subroutine of the fine tuning processing (step S107, steps S10, S14 to be described later) of FIG. 6 in FIG. 8 through FIG. 11.

Figure 8:
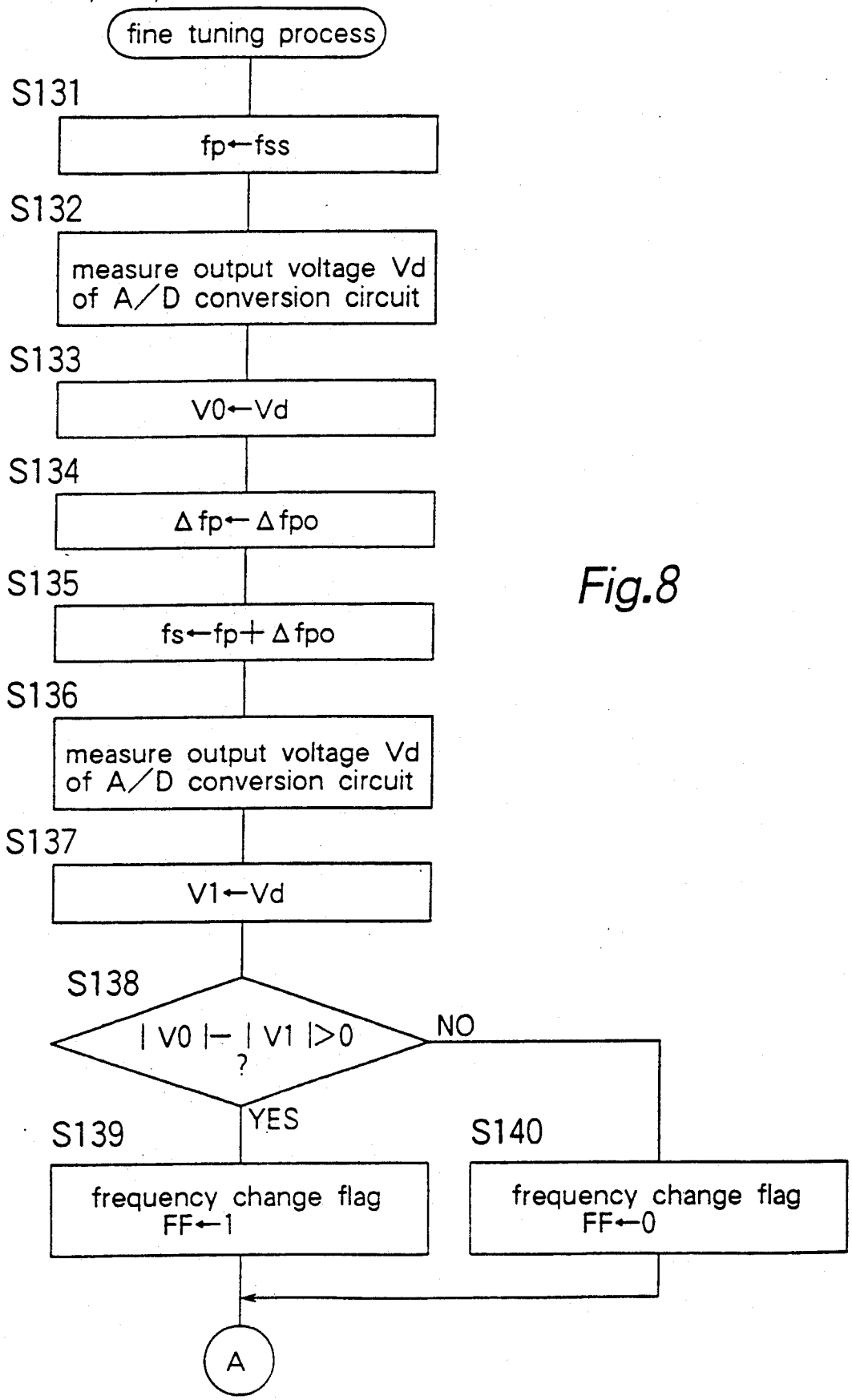
FIG. 8 is a flow chart showing a first portion of a subroutine in a modified embodiment of the fine tuning processing of FIG. 6.

As shown in FIG. 8, in a step S131, the set frequency fss is accommodated as an initial set frequency fp in the RAM53, thereafter in a step S132, the output voltage data Vd to be inputted from the A/D converting circuit 63, is converted into the output voltage VO of the low-pass passing filer 61 in a step S133, is accommodated in the RAM53. In a step S134, the initial value Δfpo of the frequency change amount to be accommodated into the predetermined ROM52 is accommodated as the frequency change amount Δfp in the RAM53. Thereafter, in a step S135, the data of the frequency fs is outputted to the signal generator 71 with frequency (fp+Δfpo) being provided as the frequency fs so as to generate the reference signal of the frequency fs. In the step S136, the output voltage data Vd to be inputted from the A/D converting circuit 63 is taken in, is converted to the output voltage V1 of the low-pass passing filter 61 in the step S137, is accommodated in the RAM53. Then, in a step S138, the absolute value |V1| of the output voltage V1 is subtracted from the absolute value |V0| of the output voltage V0, whether or not the difference of the subtracted results is larger or not in value than 0 is judged. If |V0|−|V1|>0 (YES in the step S138), in the step S138, the frequency change flag FF showing the change direction of the frequency fs of the reference signal of the signal generator 71 is set, thereafter advances to the step S141 of FIG. 9. If |V0|−|V1|≦0 (NO in the step S138), the frequency change flag FF is reset to 0 in a step S140, thereafter the step moves to a step S141 of FIG. 9.

Figure 9:
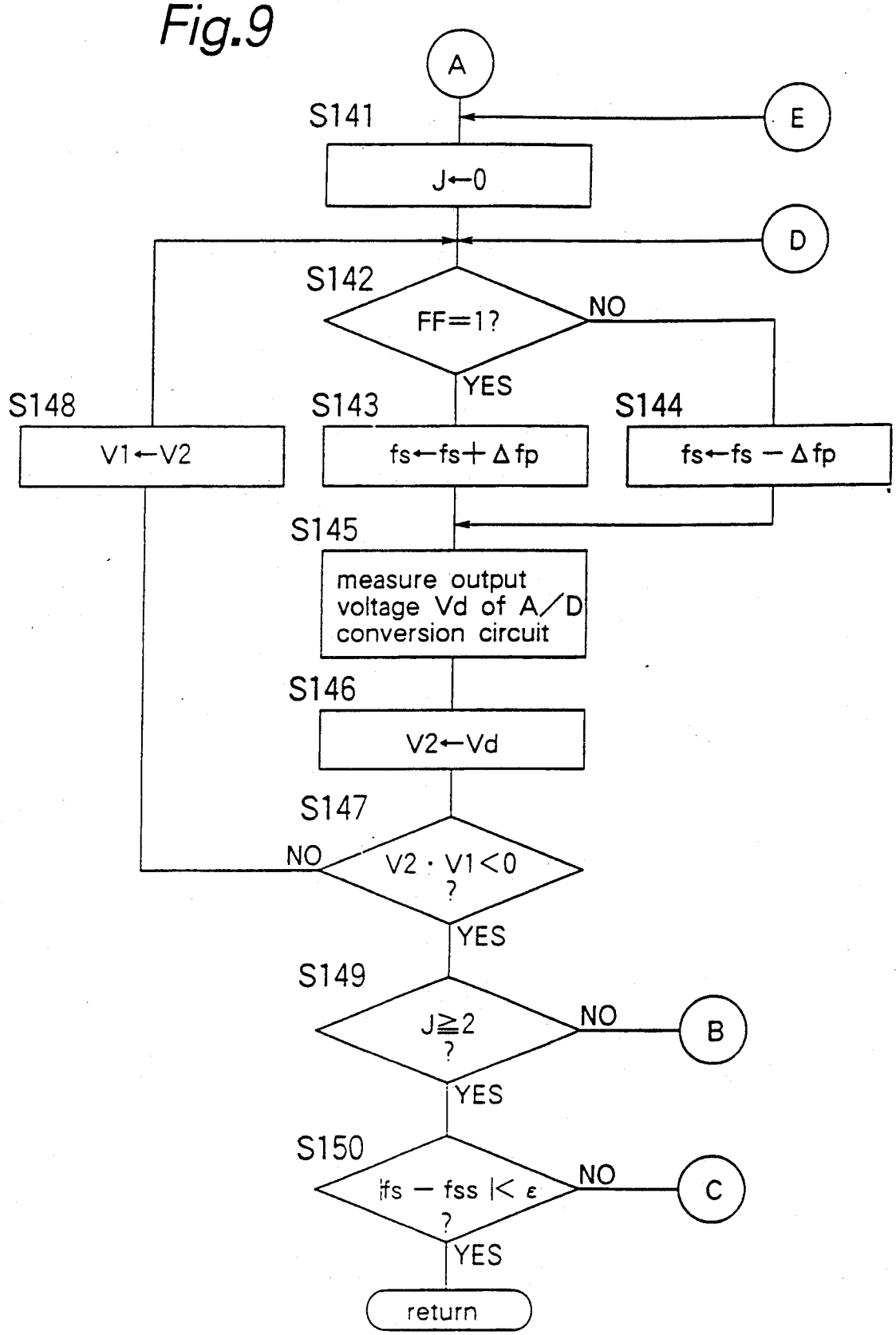
FIG. 9 is a flow chart showing a second portion of a subroutine in a modified embodiment of the fine tuning processing of FIG. 6.

As shown in FIG. 9, in the step S141 the processing parameter J is reset to 0, thereafter whether or not the frequency change flag FF is 1 is judged in a step S142. If the frequency change flag FF is 1, (YES in the step S142), in a step S143, the frequency (fs+Δfp) is set as a frequency fs so as to output the data of the frequency fs to the signal generator 71. After the reference signal of the frequency fs has been generated, the step moves to a step S145. When the frequency change flag FF is 0 (NO in the step S142), in the step S144, the frequency (fs−Δfp) is set as a frequency fs so as to output to the signal generator 71 the data of the frequency fs. After the reference signal of the frequency fs has been generated, the step moves to a step S145. In the step S145, the output voltage data Vd to be inputted from the A/D converting circuit 63 is taken in. In the step S146, it is converted to the output voltage V2 of the low-pass passing filter 61, is accommodated into the RAM53. In the step S147, it is judged whether or not the value of the product of the V2·V1 is smaller than 0. If V2·V1≧0 (NO in the step S147), the frequency of the reference signal of the signal generator 71 is changed in the same frequency changing direction again. In a step S148, the output voltage V2 accommodated in the RAN53 is accommodated in the RAM53 as the output voltage V1, thereafter the step is restored to the step S142 to continue the processing of the step S142 and its subsequent. If V2·V1<0 (YES in the step S147), in a step S149, it is judged whether or not the processing parameter J is 2 or more.

If the processing parameter J is 2 or less (NO in the step S149), judge that the processing from the above described step S142 to the step S146 is not effected in the two frequency changing directions (hereinafter referred to as two frequency changing directions) for raising and lowering the frequency fs of the reference signal of the signal generator 71, and the step moves to the step S151 of FIG. 10. When the processing parameter J is 2 or more, it is judged that the processing from the above described step S142 to the step S146 has been processed in the above described two frequency changing directions so as to move to the step S150. In the step S150, it is judged whether or not the absolute value |fs−fss| of the difference between the frequency fs of the reference signal agreeing substantially with the resonance frequency fo and the set frequency fss is smaller than a threshold value ε of the predetermined frequency error. If |fs−fss−<ε (YES in the step S150), assume that the fine tuning processing has been completed with the desired precision within the given error range and the step returns to return to the original main routine. If |fs−fss|≧ε (NO in the step S150), the frequency fs of the reference signal of the signal generator 71 is not within the given error range, the step moves to the step S161 of FIG. 11.

Figure 10:
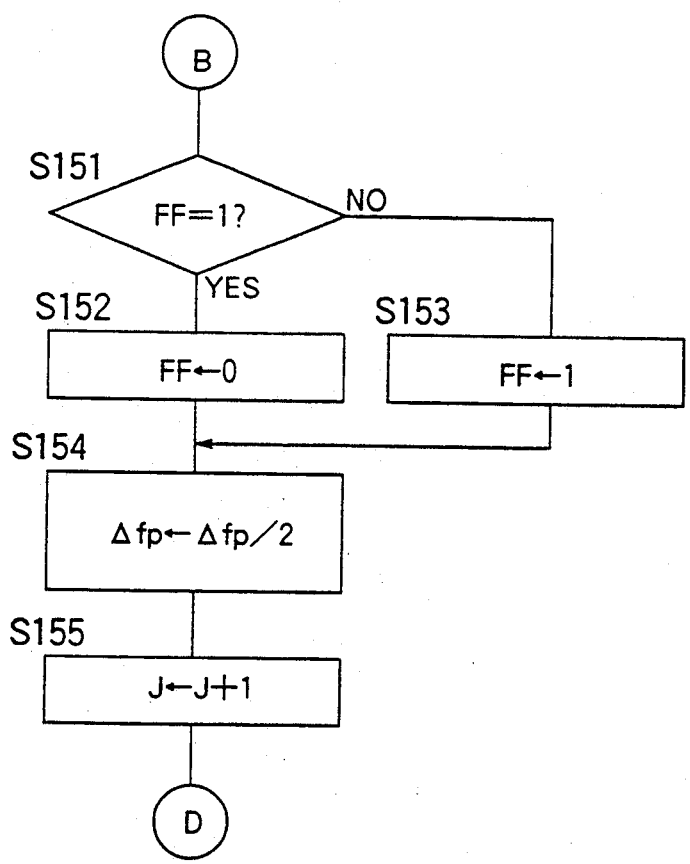
FIG. 10 is a flow chart of a third portion of a subroutine in the modified embodiment of the fine tuning processing of FIG. 6.
Figure 11:
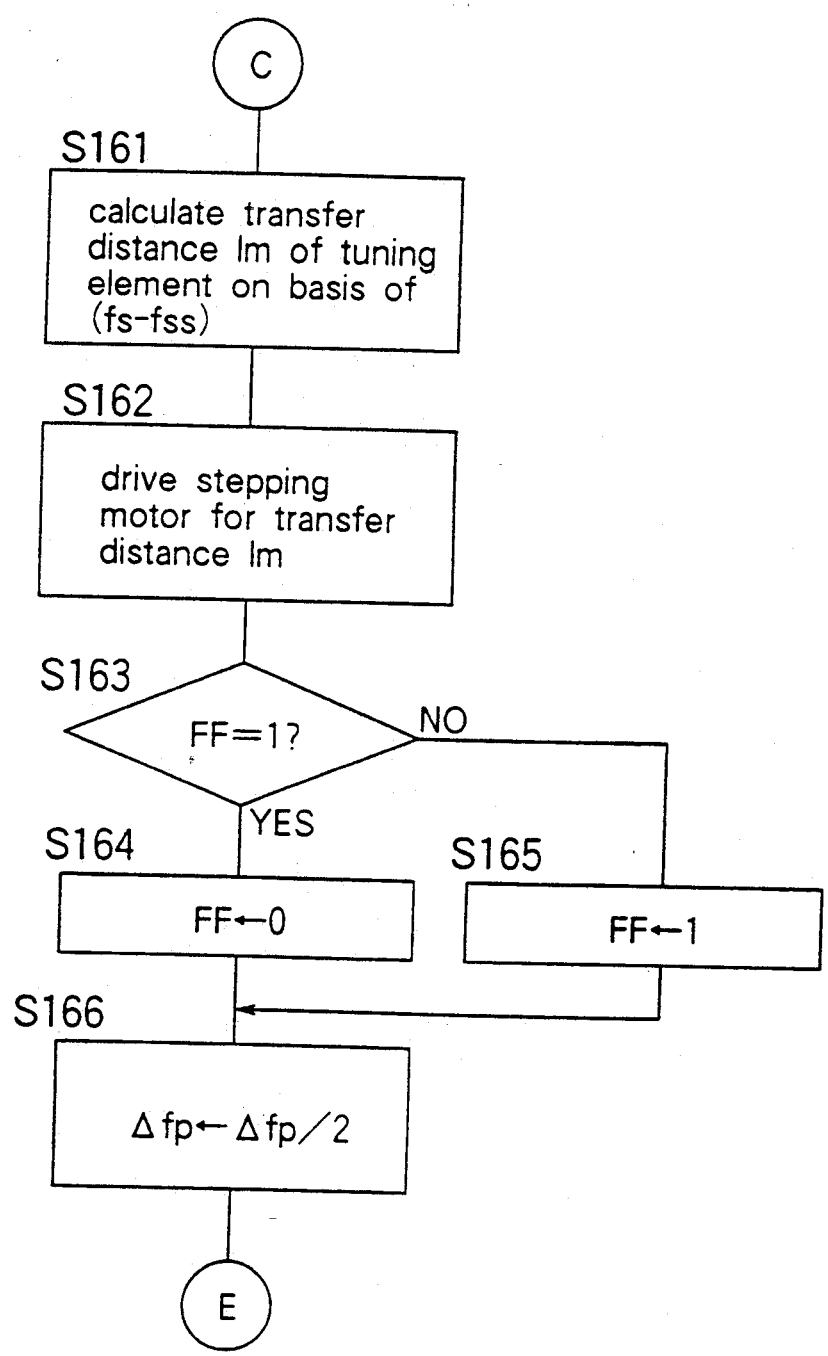
FIG. 11 is a flow chart showing a fourth portion of a subroutine in the modified embodiment of the fine tuning processing of FIG. 6.

In the step S151 of FIG. 10 to be branched from the step S149, it is judged whether or not the frequency change flag FF is 1. If the frequency change flag is 1 (YES in the step S151), in the step S152, the frequency change flag FF is reset to 0, thereafter the step moves to a step S154. If the frequency change flag is 0 (NO in the step S151), in the step S153, the frequency change flag FF is set to 1. Thereafter, the step moves to the step S154. In the steps S151 through S153, the changing direction of the frequency is changed. Thereafter, in the step S154, the frequency change amount Δfp is divided by 2 and is accommodated into the RAM53 as the frequency change amount Δfp so as to reduce the frequency change amount Δfp. Thereafter in the step S155, 1 is added to the processing parameter J. The added value is accommodated into the RAM53 as the processing parameter J. The step is restored to the step S142 of FIG. 9 so as to repeat the processing of the step S142 and its subsequent.

The frequency fs of the reference signal of the signal generator 71 is changed in the processing so far as the step S150 so that the resonance frequency fo of the dielectric resonator 31 within the band-pass filter 30 may be obtained by the change in the frequency fs of the reference signal of the signal generator 71. The frequency fs of the reference signal before the processing of the step S161 of FIG. 11 to be branched from the step S150 is approximately equal to the resonance frequency fo of the dielectric resonator 31 within the band-pass filter 30. In the step S161, the moving distance 1m for moving the dielectric tuning element 212 has been calculated with the use of a computing formula similar to the above described number 11, namely, a computing formula of 1m=k (fs−fss) in accordance with the difference (fs−fss) between the frequence fs and the set frequency fss of the reference signal generated by the signal generator 71. Thereafter, in the step S162, the pulse driving signal of the pulse number corresponding to the moving distance 1m to be calculated is inputted to the stepping motor 33 so as to move the dielectric tuning element 212. In the steps S163 through S165, processing for changing the changing direction of the frequency fs of the reference signal. In the step S163, it is judged whether or not the frequency change flag FF is 1. If the frequency change flag is 1 (YES in the step S163), in a step S164, the frequency change flag FF is reset to 0. Thereafter, the step advances to a step S166. If the frequency change flag is 0 (NO in the step S163), in the step S165, the frequency change flag FF is set to 1, thereafter, moves to the step S166. In the step S166, the value where the frequency change amount Δfp is divided by 2 is accommodated into the RAM53 as the frequency change amount Δfp so as to reduce the frequency change amount. Thereafter, the step returns to the step S141 of FIG. 9.

In a modified embodiment of the fine tuning processing shown in FIG. 8 through FIG. 11, the frequency fs of the reference signal of the signal generator 71 is changed so that the above described frequency fs may become close to the resonance frequency fo with the use of the characteristics that the insertion loss of the band-pass filter 30 shown in FIG. 5 may become minimum in the resonance frequency fo of the dielectric resonator 31. The resonance frequency fo is obtained with the approached frequency fs being approximately equal to the resonance frequency fo. Thereafter, in accordance with the obtained resonance frequency fo and the set frequency fss, the moving distance 1m for moving the dielectric tuning element 212 is calculated. By the movement of the moving distance 1m only, the fine tuning processing that the center frequency fc of the band-pass filter 30 is automatically set to the set frequency fss is effected. In the fine tuning processing illustrated in the above described in FIG. 7, the fine tuning processing is effected only by the driving operation of the stepping motor 33. In the fine tuning processing illustrated in the FIG. 8 through FIG. 11, the frequency fs of the reference signal of the signal generator 71 is changed so as to obtain the resonance frequency fo of the dielectric resonator 31 and to drive the stepping motor 33 at the same time. Generally the processing speed of moving the dielectric tuning element 212 by the driving operation of the stepping motor 33 is slower than the processing speed for setting to the given frequency the frequency of the reference signal, for example, the signal generator 71 including the PLL circuit generates so that the fine tuning processing of the modified embodiment of the latter can carry out the processing with higher speed. In the step S155, S166, 2 is used as a divisor for reducing the change amount Δfp of the frequency, and the numeral of 1 or more may be used.

The initial value Δfpo of the predetermined frequency change amount to be used in the above described step S134 is desirably about 30 kHz. The threshold value ε of the frequency error to be used in the above described step S150 is desirably 5 kHz through 10 kHz. According to the simulation of the present inventor, the frequency lag between the set frequency fss and the center frequency fc of the actual band-pass filter 30 is approximately 50 kHz through 100 kHz at the completion of the rough tuning processing in FIG. 6. By the fine k1 tuning processing shown in FIG. 7 or FIG. 8 through FIG. 11, the above described frequency lag becomes approximately 5 kHz or 10 kHz or lower. The set processing of the center frequency of the band-pass filter 30 can be effected with more precision than in the conventional embodiment.

In the above described embodiment, the data of the center frequency fd to be set with the use of the keyboard 81 is inputted. Without the restriction to it, the present invention may be provided with a receiving circuit for receiving the data of the center frequency fd from the external apparatus such as the other control circuit or the like or an interface circuit of a control circuit 50. The control circuit 50 may effect the above described tuning processing in accordance with the data of the received center frequency fd.

In the above described embodiment, the band-pass filter 30 is combined with the use of the dielectric resonator 31. Without restriction to it, the present invention may use the other various band-pass filters capable of varying the center frequency.

In the above described embodiment, the resonance frequency fo of each dielectric resonator 31 of the band-pass pass filter 30 is calculated in accordance with the output voltage Vd of the A/D converting circuit 63. The moving distance 1m for moving the dielectric tuning element 212 is calculated in accordance with the calculated resonance frequency fo. The dielectric tuning element 212 is respectively moved by the calculated moving distance 1m so as to effect the above described tuning processing. Without restriction to it, the present invention moves each dielectric tuning element 212 to do the tuning processing operation so that the output voltage Vd may become 0 in accordance with the output voltage Vd of the A/D converting circuit 63 without the calculation of the above described resonance frequency fo.

In the above described embodiment, in the set frequency fss to be set of the resonance frequency fo of the dielectric resonator 31 within the above described band-pass filter 30, a delay circuit is inverted, adjusted in advance so that the phase difference $\Delta\theta$ of each signal to be inputted to the mixer 60 becomes $2n\pi + \pi/2$ [rad] (wherein n is an integer), desirably, 2 [rad]. The center frequency fc of the band-pass filter 30 is changed so that the output voltage Vo of the low-pass passing filter 61 may become 0 so as to effect the above described tuning processing operation. Without restriction to it, in the set frequency fss to be set of the resonance frequency fo of the dielectric resonator 31 within the above described band-pass filter 30, the delay circuit is inserted, adjusted in advance so that the phase difference $\Delta\theta$ of each signal to be inputted to the mixer 60 becomes $2n\pi$ [rad], desirably, 0 [rad]. The center frequency fc of the band-pass filter 30 is changed so that the output voltage Vo of the low-pass passing filer 61 may maximum. The tuning processing operation may be effected. In the set frequency fss to be set of the resonance frequency fo of the dielectric resonator 31 within the above described band-pass filter 30, the delay circuit is inserted, adjusted in advance so that the phase difference $\Delta\theta$ of each signal to be inputted to the mixer 60 may become $2n\pi + \pi$ [rad], desirably, $\pi$ or $-\pi$ [rad]. The center frequency fc of the band-pass filter 30 is changed so that the output voltage Vo of the low-pass passing filter 61 may become minimum. The above described tuning processing operation may be effected.

In the above described embodiment, the tuning processing operation is effected digitally with the use of the stepping motor 33. Without restriction to it, the controlling, tuning processing operations may be effected so that the output voltage Vo of the low-pass passing filter 61 may become 0 by the use of the driving motor with analog signals.

Second Embodiment

Figure 12:
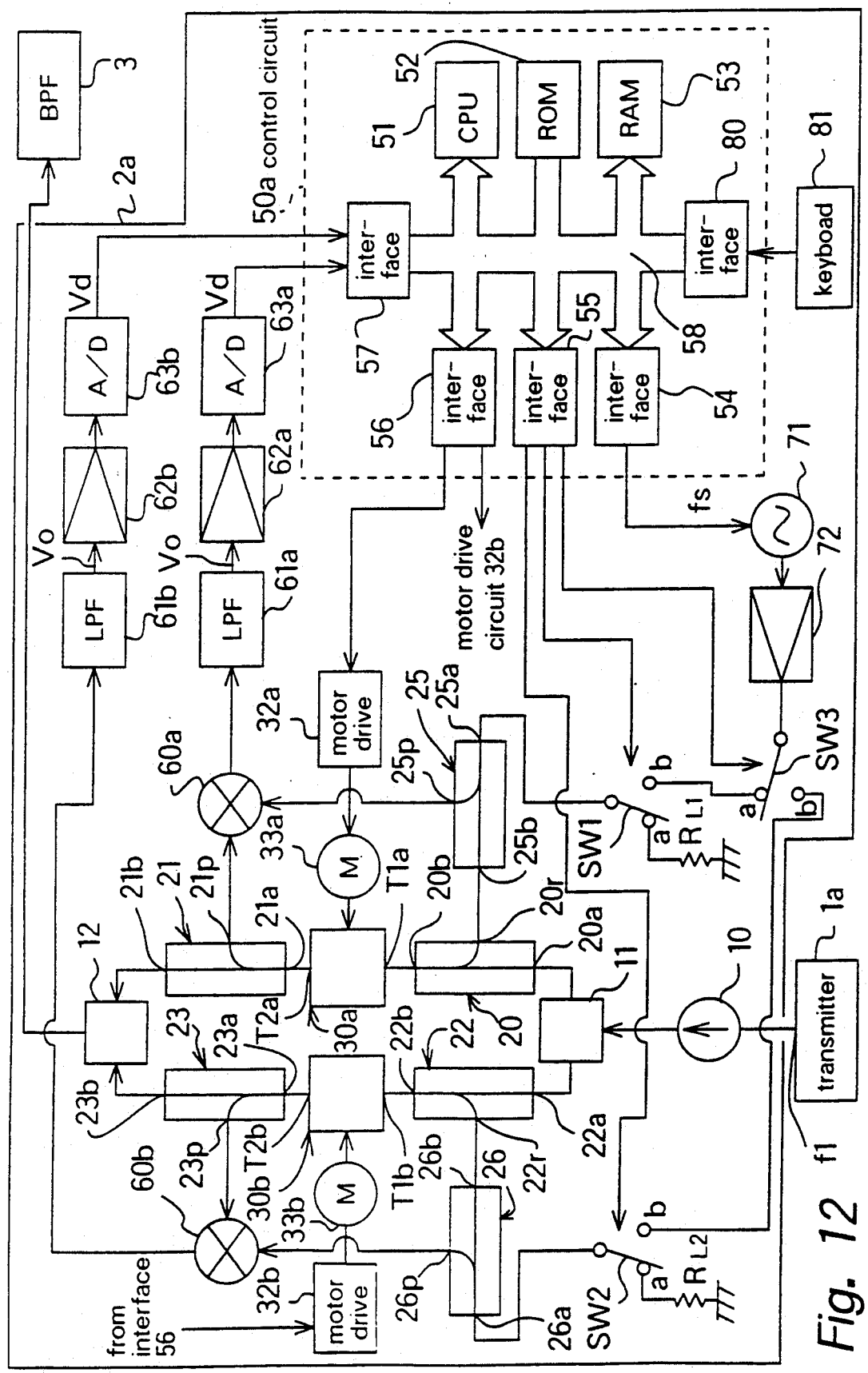
FIG. 12 is a block diagram of a two-stage auto-tuned parallel connected band-pass filter in a second embodiment of the present invention.
Figure 13:
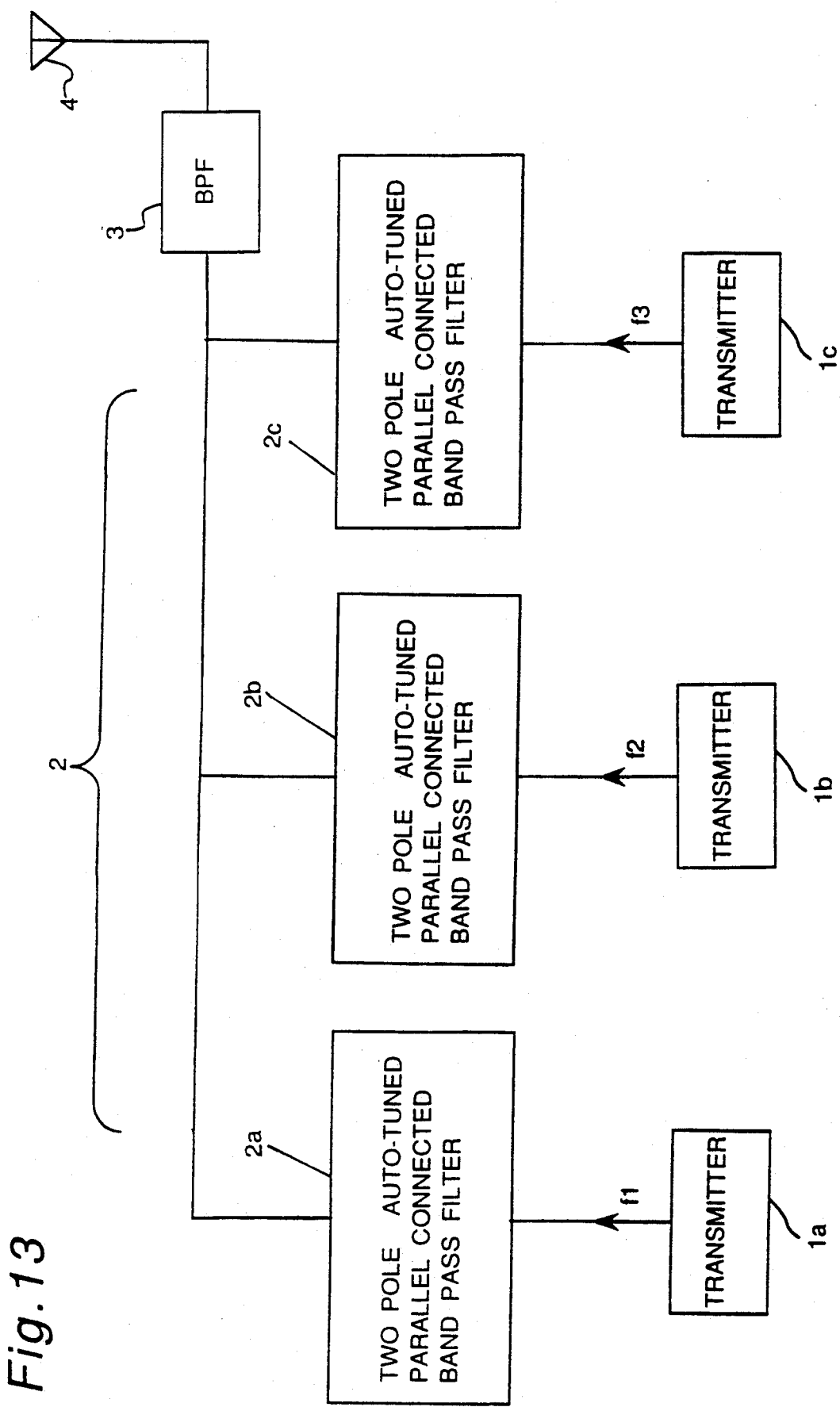
FIG. 13 is a block diagram of a transmitter multiplexer provided with three two-stage auto-tuned parallel connected band-pass filters of FIG. 12.

FIG. 13 is a block diagram of a transmitter multiplexer 2 provided with two-stage auto-tuned parallel connected band-pass filters 2a, 2b, 2c in a second embodiment of the present invention. FIG. 12 is a block diagram of a two-stage auto-tuned parallel connected band-pass filter 2a of FIG. 13. In FIG. 12 and FIG. 13, the same reference characters are given to those similar in FIG. 1.

Each of the two-stage auto-tuned parallel connected band-pass filters 2a, 2b, 2c in the present invention is connected electrically in parallel with the use of the combiner 12 and the divider and is provided with two band-pass filters 31a, 30b including one dielectric resonator 31 as compared with the automatic tuning type band-pass filter 2d in a first embodiment illustrated in FIG. 1. Each of the two-stage auto-tuned parallel connected band-pass filters 2a, 2b, 2c calculates the center frequencies f1c, f2c to be set in each band-pass filter 31a, 30b in accordance with the data of the center frequency fd and band width ΔF of the each two-stage auto-tuned parallel connected band-pass filters 2a, 2b, 2c. The signal of the above described center frequency f1c is generated in the signal generator 71 to be built in in accordance with the above-described calculated center frequency f1c. With the use of the signal as the reference signal, the center frequency fc of the band-pass filter 30a is made to approximately agree with the above described center frequency f1c. Thereafter, the signal of the above described center frequency f2c is generated in the signal generator 71 built in in accordance with the above-described calculated center frequency f2c. With the use of the signal as the reference signal, the center frequency fc of the band-pass filter 30b is made to roughly agree with the above described center frequency f2c and to tune. The center frequency and band width of each two-stage auto-tuned parallel connected band-pass filter 2a, 2b, 2c is automatically adjusted to the above-described inputted data value.

As shown in FIG. 13, each transmission signal of mutually different frequencies f1, f2, f3 (f1<f2<f3) of, for example, UHF band, which is respectively outputted from each transmitter 1a, 1b 1c and has a constant level predetermined, is composited after passing through the two-stage auto-tuned parallel connected band-pass filters 2a, 2b, 2c in the present embodiment. Here, each output terminal of each two-stage auto-tuned parallel connected band-pass filter 2a, 2b, 2c are alike electrically connected with. Each of the above described transmission signals, which are outputted to the antenna 4 through the band-pass filter 3 to be passed through the frequency band including the above described frequencies f1, f2, f3 and have been made composite by frequency multiplex, is radiated from the antenna 4. The two-stage auto-tuned parallel connected band-pass filters 2a, 2b, 2c are similar in construction. Description will be effected hereinafter in detail with reference to FIG. 12 by way of a two-stage auto-tuned parallel connected band-pass filter 2a.

As shown in FIG. 12, the signal to be outputted from the transmitter 1a is inputted to the input terminal of the divider 11 through the isolator 10. The divider 11 divides the inputted transmission signal into two so as to effect the output to the input terminal 20a of the directional coupler 20 and the input terminal 22a of the directional coupler 22.

The directional couplers 20, 21, 25 are combined generally like those in the first embodiment. The signal to be outputted from the output terminal 20b of the transmission line of the directional coupler 20 is inputted to the input terminal T1a of the band-pass filter 30a. The signal to be outputted from the output terminal T2a after the passing of the band-pass filter 30a is inputted to the first input terminal of the combiner 12 through the input terminal 21a and the output terminal 21b of the transmission line of the directional coupler 21. Also, the signal to be outputted from the output terminal 21p of the coupling line of the directional coupler 21 is connected with the major signal input terminal of the mixer 60a as the first main signal.

The directional coupler 22 is provided with a transmission line for transmitting the above described devided transmission signal, and a coupling line for reference signal composing use provided away by the given distance from the above described transmission line, on the side of the output terminal 22b of the transmission line of the directional coupler 22 so that the transmission signal transmission coupled electromagnetically to the transmission line and the reference signal to be inputted to the input terminal 22r of the coupling line may be combined. The signal to be outputted from the output terminal 22b of the transmission line of the directional coupler 22 is inputted to the input terminal T1b of the band-pass filter 30b. The signal which is outputted from the output terminal T2b after the passing through the band-pass filter 30b is inputted to the second input terminal of the combiner 12 through the input terminal 23a and the output terminal 23b of the transmission line of the directional coupler 23. The directional coupler 23 is provided with a transmission line for transmitting the signal after the passing through the band-pass filter 30b, and a coupling line for detecting the transmission signal provided away by the given distance from the transmission line, on the side of the input terminal 23a of the directional coupler 23, for detecting the transmission signal so that a part of the power of the transmission signal transmission coupled electromagnetically to the transmission line may be branched, drawn out. The coupling line for transmission signal detection use is provided with an output terminal 23p. The signal to be outputted from the output terminal 23p of the coupling line is connected with the main signal input terminal of the mixer 60b as the second main signal.

The combiner 12 combines the signal to be inputted to the first, second input terminals. The combined signal is outputted to the band-pass filter 3. Each band-pass filter 31a, 30b is combined as the band-pass filter 30 in the first embodiment is.

The signal processing system and the control system circuit within the two-stage auto-tuned parallel connected band-pass filter 2a will be hereinafter described with reference to FIG. 12.

As in FIG. 12, the signal generator 71 is combined as that of the first embodiment. In accordance with the data of the set frequency fs to be inputted through the interface circuit 54 from the CPU51 of the control circuit 50a, the reference signal of the above-described set frequency fs is generated so as to output the reference signal to the common terminal of the switch SW3 through the amplifier 72. The reference signal to be outputted from the a terminal of the switch SW3 is inputted to the input terminal 25a of the directional coupler 25 through the b side of the switch SW1. The reference signal to be inputted from the b terminal of the switch SW3 is inputted to the input terminal 26a of the directional coupler 26 through the b side of the switch SW2. The a side of the switch SW1 is connected with an earth line through a terminal resistor $R_{L1}$ having the given impedance, the a side of the switch SW2 is connected with an earth line through the terminal resistor $R_{L2}$ having the given impedance. Here each switch SW1, SW2, SW3 is respectively switched onto the a side or b side selectively through the interface circuit 55 by the CPU51 within the control circuit 50a.

The reference signal to be outputted from the output terminal 25b of the transmission line of the directional coupler 25 is inputted to the input terminal T1a of the band-pass filer 30a through the output terminal 20r of the coupling line of the directional coupler 20 and the output terminal 20b of the transmission line. The reference signal to be outputted from the output terminal 25p of the coupling line of the directional coupler 25 is inputted, as a first local oscillation signal, to the local oscillation signal input terminal of the mixer 60a.

The mixer 60a to be combined with an multiplier mixes the signals to be inputted to the main signal input terminal with the signals to be inputted to the local oscillation signal inputting terminal, multiplies them, and outputs the signal mixed to the low-pass passing filter (LPF) 61a. The signal after the mixing thereof to be outputted from the mixer 60a includes the frequency component of fs+fs and fs−fs (direct current component) is included. The low-pass passing filter 61a lets only the direct current component only pass from the mixed signal inputted, thereafter outputs the signal of the direct current component to the A/D converting circuit 63a through the amplifier 62a. The A/D converting circuit 63a converts the analog signal of the above described direct current component into the digital signal Vd so as to output to the CPU51 through the interface circuit 57 within the control circuit 50a.

A transmission line for main signal use to the main signal input terminal of the mixer 60, passing the directional coupler 25 and the output terminal 25b of the transmission line from the above described reference point, with the input terminal 25a of the directional coupler 25 as a reference point, the input terminal 20r of the coupling line of the directional coupler 20 and the output terminal 20b of the transmission line, the band-pass filter 30a, and the input terminal 21a of the directional coupler 21 and the output terminal 21p of the coupling line. The transmission line for local oscillation signal use to the local oscillation signal input terminal of the mixer 60a through the coupling line of the directional coupler 25 and the output terminal 25p from the above described reference point is made a second transmission line. The transmission phase $\theta1a$ (except for the transmission phase $\theta_R$ of the band-pass filter 30a) of the above described first transmission line and the transmission phase $\theta2a$ of the above described second transmission line in an optional frequency fa near the resonance frequency fo of the dielectric resonator 31 desirably within the band-pass filter 30a are measured in advance.

When the resonance frequency fo of the dielectric resonator 31 within the above described band-pass filter 30a is set to a certain set frequency fss, the transmission phase of the above described first transmission line except for the transmission phase $\theta_R$ of the band-pass filter 30a is made $\theta1$, and the transmission phase of the above described second transmission line is made $\theta2$ in the set frequency fss, the phase difference $\Delta\theta$ of each signal to be inputted to the mixer 60a is expressed in the following equation 7 as in the first embodiment.

In the present embodiment, in the set frequency fss-to-be-set of the resonance frequency fo of the dielectric resonator 31 within the above described band-pass filter 31a, the delay circuit (not shown) is inserted in advance into the above described first or second transmission line so that the phase difference $\Delta\theta$ of each signal to be inputted into the mixer 60a becomes $2n\pi + \pi/2$ [rad] (wherein $\pi$ is an integer), desirably, $\pi/2$ [rad].

In the present embodiment, the transmission signal to be outputted from the transmitter 1a is not inputted to the two-stage auto-tuned parallel connected band-pass filter 2a. The reference signal of, for example, the set frequency fs is generated in the signal generator 71 with the input terminal of the isolator 10 being terminated with the terminal resistor having the given impedance, the switch SW3 is switched to the a side, and the switch SW1 is switched to the b side. At this time, the voltage Vo of the direct current component to be outputted from the low-pass passing filter 61a is measured and the voltage Vo measured is substituted into the equation 10. Thereafter, the ternary simultaneous equations of the above described equation 3, the equation 7 and the equation 10 are solved. Thus, the transmission phase $\theta_R$, the insertion loss IL1, the phase difference $\Delta\theta$ of the band-pass filter 30a in the set frequency fss to be set of the center frequency of the band-pass filter 30 are calculated. Then, the calculated transmission phase $\theta_R$ is substituted into the equation 5 so as to calculate a constant F1, further the calculated constant F1 is substituted into the equation 4 so as to calculate the resonance frequency fo. The moving distance 1m for moving the dielectric tuning element 212 is calculated with the use of the next equation 11 in accordance with the calculated resonance frequency fo and the set frequency fss.

The directional coupler 26 is provided with a transmission line for transmitting a reference signal to be inputted to the input terminal 26a through the amplifier 72 and the switches SW3, SW2 from the signal generator 71, and a coupling line for reference signal detection use, for detecting the above described reference signal, provided away for the given distance only from the transmission line and on the side of the input terminal 26a of the directional coupler 26 so that a part of the current of the reference signal transmission coupled electromagnetically to the transmission line is branched, drawn out, the coupling line for reference signal detection use is provided with an output terminal 26p. The reference signal to be outputted from the output terminal 26b of the transmission line of the directional coupler 26 is inputted to the input terminal T1b of the band-pass filter 30a through the input terminal 22r of the coupling line of the directional coupler 22 and the output terminal 22b of the transmission line. The reference signal to be outputted from the output terminal 26p of the coupling line of the directional coupler 26 is inputted, as a second local oscillation signal, to the local oscillation signal input terminal of the mixer 60b.

The mixer 60b mixes the signals to be inputted to the main signal input terminal with the signals to be inputted to the local oscillation signal input terminal, multiplies them, and outputs the signal mixed to the low-pass passing filter (LPF) 61b. The signal after the mixing thereof to be outputted from the mixer 60b includes the frequency component of fs+fs and fs−fs (direct current component). The low-pass passing filter 61b lets only the voltage Vo of the direct current component only pass from the mixed signal inputted, thereafter outputs the signal of the direct current component to the A/D converting circuit 63b through the amplifier 62b. The A/D converting circuit 63b converts the analog signal of the above described direct current component into the digital signal Vd so as to output to the CPU51 through the interface circuit 57 within the control circuit 50a.

In a processing circuit system about the reference signal for generating the voltage Vo of the direct current component with the use of the second main signal and the second local oscillation signal, each formula from the equation 6 to the equation 11 is established as in the processing circuit system about the reference signal for generating the voltage Vo of the direct current component with the use of the above described first main signal and the first local oscillation signal, so that the tuning operation of the band-pass filter 30b can be effected as described hereinafter. In the present embodiment, in a set frequency fss-to-be-set of the resonance frequency fo of the dielectric resonator 31 within the above described band-pass filter 30b, the phase difference $\Delta\theta$ of each signal to be inputted to the mixer 60b may become $2n\pi + \pi/2$ [rad] (n is an integer) and desirably may become $\pi/2$ [rad]. The delay circuit (not shown) is inserted in advance, as in the processing circuit system about the reference signal for generating the voltage Vo of the direct current component with the use of the above described first main signal and the first local oscillation signal.

In the present embodiment, the transmission signal to be outputted from the transmission 1a is not inputted to the two-stage auto-tuned parallel connected band-pass filter 2a. The reference signal of, for example, the set frequency fss is generated in the signal generator 71 with the input terminal of the isolator 10 being terminated with the terminal resistor having the given impedance, the switch SW3 is switched onto the b side, and the switch SW2 is switched onto the b side. At this time, the voltage Vo of the direct current component to be outputted from the low-pass passing filter 61b is measured and the voltage Vo measured is substituted into the equation 10. Thereafter, the ternary simultaneous equation of the above described equation 3, the equation 7 and the equation 10 is solved. Thus, the transmission phase $\theta_R$, the insertion loss IL1, the phase difference $\Delta\theta$ of the band-pass filter 30b in the set frequency fss to be set of the center frequency of the band-pass filter 30 are calculated. Then, the calculated transmission phase $\theta_R$ is substituted into the equation 5 so as to calculate a constant F1, further the calculated constant F1 is substituted into the equation 4 so as to calculate the resonance frequency fo. The moving distance for moving the dielectric tuning element 212 is calculated with the use of the next equation 11 in accordance with the calculated resonance frequency fo and the set frequency fss. The pulse driving signal of the pulse number corresponding to the above described calculated moving distance 1m is inputted to the stepping motor 33b to move the dielectric tuning element 212 within the band-pass filter 30b. The tuning processing about the band-pass filter 30b can be effected so that the center frequency fc of the band-pass filer 30b may roughly agree with the above described set frequency fss.

As shown in FIG. 12, the control circuit 50a within the two-stage auto-tuned parallel connected band-pass filter 2a is provided with an interface circuit 55 to be connected with switches SW1, SW2, SW3 with comparison with the control circuit 50 in the first embodiment. The CPU51 executes each of the above described tuning processing of each of the band-pass filter 31a, 30b and controls the dielectric resonator 31 within the band-pass filters 30a, 30b. Also, the motor driving circuits 32a, 32b are connected with the interface circuit 56, and the A/D converting circuits 63a, 63b are connected with the interface circuit 57.

When each tuning processing of each tuning processing of each band-pass filter 31a, 30b is executed, the CPU51 calculates the center frequencies f1c, f2c to be set respectively in each band-pass filter 31a, 30b with the use of the following equation 12, the equation 13 in accordance with the center frequency fd and the band width $\Delta F$ to be set in the two-stage auto-tuned parallel connected band-pass filter 2a to be inputted with the use of the keyboard 81 as described later in detail. In the present embodiment, the processing of taking in the center frequency fd and the band width $\Delta F$ to be set in the two-stage auto-tuned parallel connected band-pass filter 2a to the RAM53 through the interface circuit 80 from the keyboard 81 is effected with the interruption processing of the CPU51.

$$f1c = fd - 2a_2 \Delta F \tag{12}$$

$$f2c = fd + 2a_2 \Delta F \tag{13}$$

Here, a2 is within the range of desirably $0.8 < a_2 < 2.0$, is a constant to be predetermined depending upon the loaded $Q(Q_L)$ of the dielectric resonator 31 within each band-pass filter 30a, 30b, is accommodated previously in the ROM52.

The CPU51 effects the tuning processing (hereinafter referred to as first tuning processing) about the band-pass filter 30a for making the resonance frequency fo of the dielectric resonator 31 within the band-pass filter 30a agree roughly with the frequency f1c of the above described reference signal after generating the reference signal of the frequency f1c in the signal generator 71. Thereafter, the tuning processing (hereinafter referred to as second tuning processing) about the band-pass filter 30b for making the resonance frequence fo of the dielectric resonator 31 within the band-pass filter 30b agree roughly with the frequency f2c of the above described reference signal after generating the reference signal of the frequency f2c in the signal generator 71.

In the first tuning processing, the motor driving signal for driving the stepping motor 33a is outputted, driven to the stepping motor 33a through the interface circuit 56 and the motor driving circuit 32a, as the level of the signal of the above described direction current component to be inputted to the CPU51 through the interface circuit 57 from the A/D converting circuit 63a so as to move the dielectric tuning element 212 within the band-pass filter 30a. At this time, the electrostatic capacity of the variable capacitance VC in the equivalent circuit of FIG. 2 changes to change the resonance frequency fo of the dielectric resonator 31, so that the center frequency fc of the band-pass filter 30a approximately equal to the resonance frequency fo can be changed. In the present embodiment, the control circuit 50a drives the stepping motor 33a so that the level of the direct current component to be outputted from the low-pass passing filter 61a may become 0 so as to change the resonance frequency of the dielectric resonator 31 within the band-pass filter 30a. Therefore, the center frequency fc of the band-pass filter 3 approximately equal to the resonance frequency fo can be approximately made to agree with the frequency of the reference signal to be generated by the signal generator 71.

In a second tuning processing, as in the first tuning processing, the motor driving signal for driving the stepping motor 33b is outputted to the stepping motor 33b through the interface circuit 56 and the motor driving circuit 32b to effect the driving operation so that the level of the signal of the above described direct current component to be inputted to the CPU51 through the interface circuit 57 from the A/D converting circuit 63b. Here, the control circuit 50a drives the stepping motor 33b so that the level of the direct current component to be outputted from the low-pass passing filter 61 may become 0 so as to change the resonance frequency of the dielectric resonator 31 within the band-pass filter 30b. Therefore, the center frequency fc of the band-pass filter 30b approximately equal to the resonance frequency fo can be made to approximately agree with the frequency f2c of the reference signal to be generated by the signal generator 71.

By the execution of the above described first and second tuning processing, the center frequency and the band width of the two-stage auto-tuned parallel connected band-pass filter 2a may be respectively set automatically to each data value fd, ΔF inputted with the use of the keyboard 81.

Figure 14:
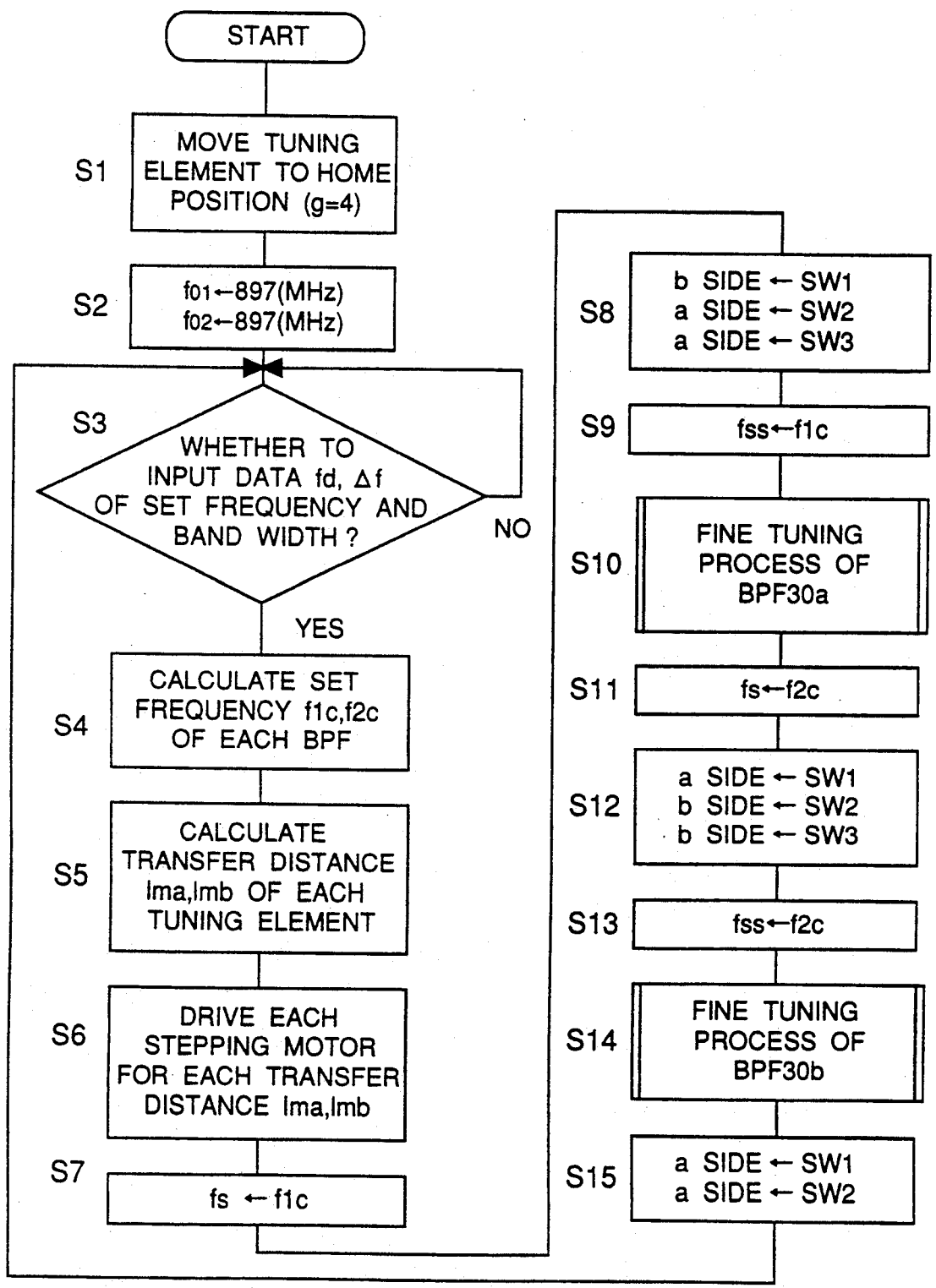
FIG. 14 is a flow chart showing a main routine of a control flow of the control circuit of the two-stage auto-tuned parallel connected band-pass filter of FIG. 12.
Figure 15:
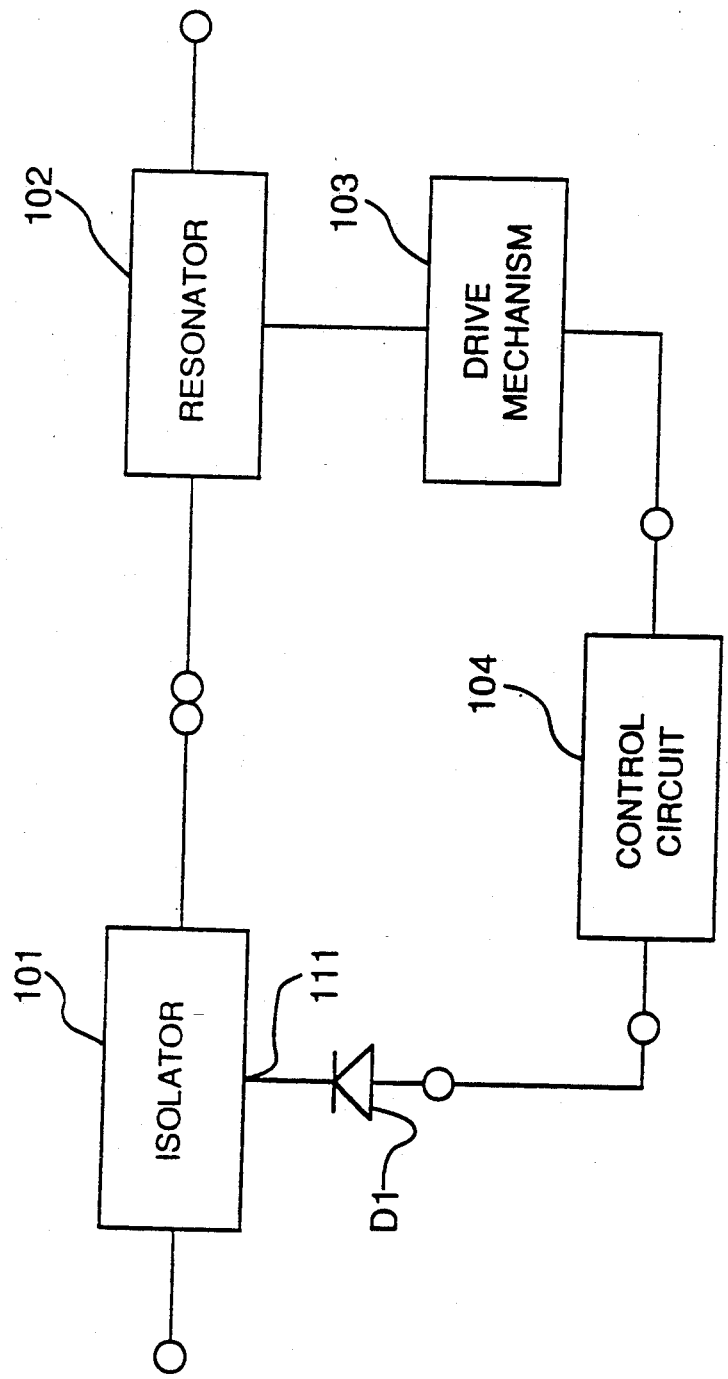
FIG. 15 is a block diagram of an automatic tuning type band-pass filter in the conventional embodiment.

FIG. 14 is a flow chart showing the main routine of the tuning processing of the control circuit 50 of the two-stage auto-tuned parallel connected band-pass filter 2a of FIG. 12. The main routine executes the above described first and second tuning processing, and is a processing operation for automatically setting into each data value fd, ΔF inputted with the use of the keyboard 81, the center frequency and the band width of the band-pass filter 2a. In the initial condition before the start of the main routine, the dielectric tuning element 212 of the dielectric resonator 31 within each band-pass filter 31a, 30b is positioned in the optional distance g. In the main routine, the processing of the step 5 and the step S6 is a rough tuning processing operation for respectively changing the center frequency fc of each band-pass filter 31a, 30b built in into the frequency near the set frequency f1c, f2c to be set. The processing operation from the step S7 to the step S10 is a first fine tuning processing operation which changes the center frequency fc of the band-pass filter 30a built in from the frequency near the above described frequency f1c after the above described rough tuning processing operation so as to roughly agree with the above described frequency f1c. The processing from the step S11 to the step S14 is a second fine tuning processing operation which changes the center frequency fc of the built-in band-pass filter 30b from the frequency near the above described frequency f2c after the above described rough tuning processing operation so as to make it to approximately agree with the above described frequency f2c.

When the power switch (not shown) of the control circuit 50a is turned on, the main routine of the tuning processing of FIG. 14 is started. In the step S1, the respective dielectric tuning elements 212 within the respective band-pass filters 30a, 30b are moved to a home position respectively by the driving of the stepping motors 33a, 33b. In the present embodiment, a stopper (not shown) for the dielectric tuning element is provided within each band-pass filter 30a, 30b so that the dielectric tuning element 212 within each band-pass filter 30a, 30b may not be moved in the direction of an arrow A1 from the above described home position. In the step S1, when the motor driving signal of the − polarity of pulse is inputted continuously to the stepping motors 33a, 33b and each dielectric tuning element 212 is stopped in the home position by the above described stopper, the microswitch (not shown) provided in the home position is turned on, thus stopping the driving operation of each stepping motor 33a, 33b.

In the step S2, 897 [MHz] is set as the data of the resonance frequency fo1 of the dielectric resonator 31 within the present band-pass filter 30a, and is accommodated in the RAM53. The 897 [MHz] is set as the data of the resonance frequency fo2 of the dielectric resonator 31 within the present band-pass filter 30b, and is accommodated in the RAM53. In the step S3, whether or not the data of the center frequency fd and the band width ΔF to be set in the two-stage auto-tuned parallel connected band-pass filter 2a have been inputted is judged with the use of the keyboard 81. When the data have not been inputted (NO in the step S3), the loop processing of the step S3 is repeated into a waiting condition. When the data have been inputted (YES in the step S3), the step moves to the step S4. In the step S4, in accordance with the data of the inputted center frequency fd and the band width ΔF, the center frequencies (hereinafter referred to as to set frequencies) f1c, f2c to be set in each band-pass filter 30a, 30b are calculated with the use of the above described equation 12 and the equation 13, and thereafter these data are accommodated in the RAM53.

In the step S5, in order to effect the rough tuning processing, the moving distances 1ma, 1mb to move the dielectric tuning element 212 within each band-pass filter 30a, 30b are calculated with the use of the next equation 14 and equation 15 which are similar in the computing formula to the equation 11 in accordance with the data of the resonance frequencies fo1, fo2 accommodated in the RAM53 and the data of the set frequencies f1c, f2c.

$$1ma = k\,(fo - f1c) \tag{14}$$

$$1mb = k\,(fo - f2c) \tag{15}$$

In the step S6, the pulse driving signals of the pulse number corresponding to the calculated moving distances 1ma, 1mb are respectively inputted to the stepping motors 33a, 33b so as to move the dielectric tuning elements 212 within the band-pass passing filters 30a, 30b are moved. When the moving distances 1ma, 1mb are positive, the pulse driving signals of + polarity are inputted to the stepping motors 33a, 33b. The dielectric tuning elements 212 are moved in the direction of an arrow A2 by the moving distances 1ma, 1mb. When the moving distances 1ma, 1mb are negative, the pulse driving signals of − polarity are inputted to the stepping motors 33a, 33b. The dielectric tuning elements 212 are moved in the direction of an arrow A1 by the moving distances 1ma, 1mb. The rough tuning processing operation is completed.

In order to effect the first fine tuning processing, the data of the set frequency f1c in the step S7 is outputted as the set frequency fs to the signal generator 71 so as to generate the reference signal of the set frequency f1c in the signal generator 71. Thereafter, in the step S8, the switch SW1 is switched onto the b side, the switch SW2 is switched onto the a side, the switch SW3 is switched onto the a side. In the step S9, the set frequency f1c is accommodated in the RAM53 as the set frequency fss. Thereafter, in the step S10, the center frequency fc of the band-pass filter 30a to be built in is changed from the frequency near the above described set frequency f1c after the above described rough tuning processing, and the fine tuning processing operation (see FIG. 7 or FIG. 8 through FIG. 11) for making the center frequency agree approximately with the above described set frequency f1c. Thereafter, the step moves to the step S11.

In order to effect the second fine tuning processing, the data of the set frequency f2c in the step S11 is outputted as the set frequency f2c to the signal generator 71 so as to generate the reference signal of the set frequency f2c in the signal generator 71. Thereafter, in the step S12, the switch SW1 is switched onto the a side, the switch SW2 is switched onto the b side, the switch SW3 is switched onto the b side. In the step S13, the set frequency f2c is accommodated in the RAM53 as the set frequency fss. Thereafter, in the step S14, the center frequency fc of the band-pass filter 30b to be built in is changed from the frequency near the above described set frequency f2c after the above described rough tuning processing operation so as to execute the fine tuning processing operation (see FIG. 7 and FIG. 8 through FIG. 11) for making the center frequency roughly agree with the above described set frequency f2c, and thereafter, in the step S15, the switch SW1 is switched onto the a side, the switch SW2 is switched on the a side so as to return to the step S3. Hereafter, the above described rough tuning processing and the above described first, second fine tuning processing are repeated, by the use of the keyboard 81, every time the center frequency and the band width of the parallel two-stage automatic tuning type band-pass filter 2a are newly inputted.

In the two-stage auto-tuned parallel connected band-pass filter 2a constructed as shown in FIG. 12, the directional couplers 21, 23, 25, 26 are provided even when, for example, the components of the transmission signals of the frequencies f2, f3 are turned round, inputted to the band-pass filter 2a through the two-stage auto-tuned parallel connected band-pass filters 2b, 2c from the transmitters 1b, 1c of the other channel, so that the frequency component to turn round from the other channel are not inputted to the mixers 60a, 60b. Accordingly, as in the conventional embodiment, the above described tuning processing can be effected without influences upon the frequency component to turn round from the other channel.

Even where a divider or the like, instead of the directional couplers 21, 23, 25, 26 to which reflection signals are outputted, when the frequencies f2, f3 of the other channel are away sufficiently with respect to the frequency f1 of the transmission signal to be outputted from the transmitter 1a, the above described turn-round signals of the other channel are inputted to the local oscillation signal input terminals of the mixers 60a, 60b after the turn-round signals of the other channel have passed through the band-pass filters 30a, 30b having an attenuation amount sufficiently large with respect to the frequencies f2, f3. The level of the direct component about the frequency f2, f3 of the above described other channel, appearing in the output of the low-pass passing filters 61a, 61b is considerably small, thus hardly giving influences upon the above described tuning processing. Therefore, the above described tuning processing operation can be effected without receiving the influences upon the frequency component to turn round from the other channel as in the conventional embodiment.

The two-stage auto-tuned parallel connected band-pass filters 2b and 2c are similar in construction to the above described two-stage auto-tuned parallel connected band-pass filter 2a. In the respective parallel two-stage automatic tuning type band-pass filters 2b, 2c, the above described tuning processing operation is effected so that the center frequencies of the built-in band-pass filters 30a, 30b may agree roughly with the respective set frequencies f1c, f2c calculated in accordance with the center frequencies and the band widths of the band-pass filters 2b, 2c inputted with the use of the keyboard 81.

In the above described embodiment, the data of the center frequency fd and the band width $\Delta F$ to be set with the use of the keyboard 81 are inputted. Without restriction to it, in the present invention, a receiving circuit for receiving each data of the center frequency fd and the band width $\Delta F$ from the external apparatus such as the other control circuit or the like or an interface circuit of the control circuit 50a are provided. The control circuit 50a may calculate the set frequencies f1c, f2c in accordance with each data of the center frequency fd and the band width $\Delta F$ received.

In the above described embodiment, a first circuit system of a mixer 60a necessary for effecting the first tuning processing, a low-pass passing filter 61a, an amplifier 62a, an A/D converting circuit 63a, a motor driving circuit 32a, a stepping motor 33a and so on, and a second circuit system of a mixer 60b necessary for effecting the second tuning processing, a low-pass filter 61b, an amplifier 62b, an A/D converting circuit 63b, a motor driving circuit 32b, a stepping motor 33b and so on are provided separately. One circuit system and a change-over switch may be provided without separate provision thereof, without restriction to it. The present invention may be constructed so that the selective use may be effected with respect to the first and second tuning processing.

In the above described embodiment, a transmitter multiplexer 2 shown in FIG. 13 is provided with three two-stage auto-tuned parallel connected band-pass filters 2a, 2b, 2c with two band-pass filters 31a, 30b being connected in parallel. The present invention may be adapted to connected with the respective output terminals with a plurality of automatic tuning type band-pass filters 2d in the first embodiment shown in FIG. 1 without restriction to it.

In the above described embodiment, the two-stage auto-tuned parallel connected band-pass filters 2a, 2b, 2c connected in parallel to two band-pass filters 30a, 30b have been described. The present invention may be applied to the multi-poles auto-tuned parallel connected band-pass filter with a plurality of band-pass filters 30 being connected in parallel, without restriction to it.

In a case where the three-pole auto-tuned parallel connected band-pass filter provided with four band-pass filters 30, the center frequencies f1c, f2c, f3c to be set respectively can be calculated in each band-pass filter 30 with the use of the next equation 16, the equation 17, the equation 18 in accordance with the center frequency fd and the band width $\Delta F$ to be set with the use of the keyboard 81.

$$f1c = fd - 2a_3\Delta F \tag{16}$$

$$f2c = fd + 2b_3\Delta F \tag{17}$$

$$f3c = fd + 2c_3\Delta F \tag{18}$$

Here each positive constants a3, b3, c3 are desirably within the range of $0.8 < a_3 = c_3 < 2.0$, and of $|b_3| << a_3$ and are predetermined constants depending upon the loaded Q ($Q_L$) of the dielectric resonator 31 within each band-pass filter.

In a case where the parallel four-pole auto-tuned parallel connected band-pass filter provided with four band-pass filters 30, the center frequencies f1c, f2c, f3c, f4c to be set respectively can be calculated in each band-pass filter 30 with the use of the next equation 19 through the equation 22 in accordance with the center frequency fd and the band width-F-to-be-set to be inputted with the use of the keyboard 81.

$$f_{1c} = fd - 2a_4 \Delta F \tag{19}$$

$$f_{2c} = fd - 2b_4 \Delta F \tag{20}$$

$$f_{3c} = fd + 2c_4 \Delta F \tag{21}$$

$$f_{4c} = fd + 2d_4 \Delta F \tag{22}$$

Here each positive constants a4, b4, c4, d4 are desirably within the range of $0.2 < b4 = c4 < a4 = d4 < 2.0$, and are predetermined constants depending upon the loaded Q ($Q_L$) of the dielectric resonator 31 within each band-pass filter.

Likewise, even in a case of the multi-pole auto-tuned parallel connected band-pass filter provided with five band-pass filters 30 or more, the respective center frequencies to be set in the respective band-pass filters 30 can be calculated.

In the above described embodiment, the band-pass filters 30a, 30b are connected in parallel through the divider 11 and the combiner 12. Here when the adjusting operation of the set processing of the center frequency of the band-pass filter 30a or 30b receives the influence of the loaded connected with the band-pass filter to be processed, a change-over switch for cutting off the loaded at the set processing of the above described center frequency. A change-over switch for cutting off the band-pass filter 30a from the loaded may be provided, for example, between the divider 11 and the input terminal 20a of the directional coupler 20, and between the output terminal 21b of the directional coupler 21 and the combiner 12 for the set processing of the center frequency of the band-pass filter 30a. A change-over switch for cutting off the band-pass filter 30b from the loaded may be provided, for example, between the divider 11 and the input terminal 22a of the directional coupler 22, and between the output terminal 23b of the directional coupler 23 and the combiner 12 for the set processing of the center frequency of the band-pass filter 30b.

As is clear from the foregoing description, in an auto-tuned apparatus for a band-pass filter in the first embodiment of the invention as described hereinabove, the reference signals having the given frequency to be set are generated, the above described reference signals generated are mixed with signals to be outputted from the above described band-pass filter when the above described reference signals have been inputted to the above described band-pass filter so as to multiply them for outputting the signals of the multiplied results. The direct current component signals from the multiplied results are filtered. The above described band-pass filter is controlled so that the center frequencies of the above described band-pass filter may agree with the frequencies of the above described reference signal in accordance with the signal of the direct current component to be outputted. Even when interference wave signals having the frequency component away sufficiently with respect to the frequency of the above described reference signal are inputted to the output terminal of the above described band-pass filter, the level of the direct current component about the frequency component of the above described interference wave signal to appear in the output of the above described low-pass filtering means is considerably small, thus hardly giving influences upon the above described auto-tuned operation. Therefore, the center frequency of the above described band-pass filter can be adjusted automatically to the desired set value with simple circuit construction and precision better than in the conventional embodiment.

An automatic tuning type band-pass filter described herein comprises a band-pass filter capable of changing the center frequency, an auto-tuned apparatus described in the first, second, third, fourth, fifth or sixth embodiment of the invention so as to construct an automatic tuning type band-pass filter.

An transmitter multiplexer described in the eighth embodiment of the invention comprises a plurality of automatic tuning type band-pass filters described in the seventh embodiment of the invention, an electric connection together with the output terminals of the described automatic tuning type band-pass filters, outputting each signal to be outputted from each band-pass filter within each of the above described automatic tuning type band-pass filters. The above described auto-tuned operation can be effected without the influences of the signals to be reflected from another channel being applied upon the above described respective automatic tuning type band-pass filters.

An auto-tuned apparatus for the multi-pole parallel connected band-pass filter described in the ninth embodiment of the invention in accordance with the present invention, each center frequency to be set in each of the above described band-pass filters is calculated in accordance with the center frequency and the band width to be set in a multi-pole parallel connected band-pass filter where a plurality of band-pass filters have been connected in parallel, each reference signal having each center frequency calculated is generated, the respective reference signals to be generated are mixed with, are multiplied by the respective signals to be outputted from the respective band-pass filters when each of the reference signals has been inputted respectively into the each of the band-pass filters, each signal of the direct current component from each signal of the multiplied results is filtered, the respective band-pass filters are controlled so that the center frequencies of each of the band-pass filters may agree with the frequencies of each of the reference signals in accordance with each signal of the direct current component filtered. Even when interference wave signals having the frequency component away sufficiently with respect to the frequency of the above described reference signal are inputted to the output terminal of the above described band-pass filter, the level of the direct current component about the frequency component of the above described interference wave signal to appear in the output of the above described low-pass filtering means is considerably small, thus hardly influencing the above described auto-tuned operation. Therefore, the center frequency and band width of the above described multi-pole parallel connected band-pass filter can be adjusted automatically to the desired set value with simple circuit construction and precision better than in the conventional embodiment.

A multi-poles auto-tuned parallel connected band-pass filter described in the fifteenth embodiment of the invention is provided with a multi-poles parallel connected band-pass filter where a plurality of band-pass filters capable of changing the center frequencies are electrically connected in parallel, and an auto-tuned apparatus described in the ninth, tenth, eleventh, thirteenth or fourteenth embodiment of the invention so as to construct a multi-pole auto-tuned parallel connected band-pass filter.

A transmitter multiplexer described in the sixteenth embodiment of the invention is provided with a plurality of multi-pole auto-tuned parallel connected band-pass filters described in the fifteenth embodiment of the invention, each output terminal of each of the above described multi-pole auto-tuned parallel connected band-pass filters for outputting each signal to be outputted from each band-pass filter within each of the above described multi-pole auto-tuned parallel connected band-pass filters is electrically connected, the above described auto-tuned operation can be effected without influence by the signal to be reflected from another channel being applied upon each of the multi-pole auto-tuned parallel connected band-pass filters.

Although the present invention has been fully described by way of example with reference to the accompanying drawings, it is to be noted here that various changes and modifications will be apparent to whose skilled in the art. Therefore, unless otherwise such changes and modifications depart from the scope of the present invention, they should be construed as included therein.

What is claimed is:

1. An auto-tuned apparatus for a band-pass filter, which is adapted to automatically set to a given frequency the center frequency of the band-pass filter, comprising signal generating means for generating reference signals representative of the given frequency, mixing means for mixing said reference signals generated by the signal generating means with output signals of the band-pass filter, to effect multiplication, and outputting a multiplied result signal, low-pass filtering means for deriving a direct current component from the multiplied result signal, and control means for controlling the band-pass filter so that the center frequency of the band-pass filter corresponds to the reference signal, said control means being responsive to said direct current component outputted from the low-pass filtering means.

2. The auto-tuned apparatus as defined in the claim 1, where the auto-tuned apparatus further comprises a first coupling means which is provided between the signal generating means and an input terminal of the band-pass filter, and between the signal generating means and the mixing means, which outputs to the input terminal of the band-pass filter the reference signal generated by the signal generating means, and also outputs the reference signal to the mixing means, and a second coupling means which is provided between an output terminal of the band-pass filter and an output terminal of the auto-tuned apparatus, and between the output terminal of the band-pass filter and the mixing means, which outputs to the output terminal of the auto-tuned apparatus the signal outputted from the output terminal of the band-pass filter, and also outputs the signal outputted from the output terminal of the band-pass filter to the mixing means.

3. The auto-tuned apparatus as defined in claim 1, where the auto-tuned apparatus is further provided with an input means for inputting the center frequency to be set in the band-pass filter.

4. The auto-tuned apparatus as defined in claim 1, where the auto-tuned apparatus is further provided with a receiving means for receiving, from an external apparatus, information representative of the center frequency to be set in the band-pass filter.

5. The auto-tuned apparatus as defined in claim 2, where the auto-tuned apparatus is further provided with an input means for inputting the center frequency to be set in the band-pass filter.

6. The auto-tuned apparatus as defined in claim 2, where the auto-tuned apparatus is further provided with a receiving means for receiving from an external apparatus information representative of the center frequency to be set in the band-pass filter.

7. The auto-tuned apparatus as defined in any of claims 1, 2, 3, 4, 5 or 6, where the band-pass filter is provided with a resonator, the control means is adapted to calculate the resonance frequency of the resonator in accordance with the signal of the direct current component outputted from the low-pass filtering means so as to control the band-pass filter so that the center frequency of the band-pass filter agrees with the frequency of the reference signal in accordance with the calculated resonance frequency.

8. An automatic tuning type band-pass filter comprising a band-pass filter capable of changing the center frequency, and the auto-tuned apparatus described in claim 7.

9. A transmitted multiplexer, where a plurality of automatic tuning type band-pass filters described in claim 8 are provided, the output terminals of the described automatic tuning type band-pass filter, which output the respective signals from each band-pass filter within each of the automatic tuning type band-pass filters, are connected together electrically.

10. The auto-tuned apparatus as defined in any of claims 1, 2, 3, 4, 5 or 6 where the band-pass filter is provided with the resonator, a control means controls the signal generating means so that the frequency of the reference signal agrees with the center frequency of the band-pass filter in accordance with the direct current component outputted from the low-pass filtering means so as to change the frequency of the reference signal, and controls the band-pass filter so that the center frequency of the band-pass filter agrees with the frequency of the reference signal in accordance with the frequency of the changed reference signal.

11. An automatic tuning type band-pass filter comprising a band-pass filter capable of changing the center frequency, and the auto-tuned apparatus described in claim 10.

12. A transmitter multiplexer, where a plurality of automatic tuning type band-pass filters described in claim 11 are provided, the output terminals of the described automatic tuning type band-pass filters, which output respective signals from each band-pass filter within each of the automatic tuning type band-pass filters, are connected together electrically.

13. An automatic tuning type band-pass filter comprising a band-pass filter capable of changing the center frequency, and the auto-tuned apparatus described in any of claims 1, 2, 3, 4, 5 or 6.

14. A transmitted multiplexer, where a plurality of automatic tuning type band-pass filters described in claim 13 are provided, and the output terminals of the described automatic tuning type band-pass filter, which output respective signals from each band-pass filter within each of the automatic tuning type band-pass filters, are connected together electrically.

15. An auto-tuned apparatus for a multi-pole parallel connected band-pass filter, comprising computing means for calculating a respective center frequency to be set in each of a plurality of band-pass filters in accordance with a center frequency and a bandwidth to be set in a multi-pole parallel connected band-pass filter, where a plurality of band-pass filters have been electrically connected in parallel, signal generating means for generating reference signals representative of each center frequency computed by the computing means, mixing means for mixing the respective reference signals generated by the signal generating means with reference signals outputted from the respective band-pass filters so as to effect a multiplying operation and outputting respective multiplied result signals, low-pass filtering means for deriving a direct current component from each multiplied result signal, and control means for controlling the band-pass filters so that the center frequency of each of the band-pass filters corresponds to each of the reference signals, said control means being responsive to said direct current components outputted from the low-pass filtering means.

16. The auto-tuned apparatus as defined in the claim 15, where the auto-tuned apparatus further comprises
a first coupling means which is provided between the signal generating means and an input terminal of each of the band-pass filters, and between the signal generating means and the mixing means, which outputs to the input terminal of each of the band-pass filters each reference signal generated by the signal generating means, and also outputs each of the reference signals to the mixing means, and
a second coupling means which is provided between an output terminal of each of the band-pass filters and an output terminal of the auto-tuned apparatus, and between the output terminal of each of the band-pass filters and the mixing means, which outputs to the output terminal of the auto-tuned apparatus each signal to be outputted from the output terminal of each band-pass filter, and also outputs each signal outputted respectively from the output terminal of each of the band-pass filters to the mixing means.

17. The auto-tuned apparatus as defined in claim 15, where the auto-tuned apparatus is further provided with an input means for inputting the center frequency and the bandwidth to be set in the described multi-poles parallel connected band-pass filter.

18. The auto-tuned apparatus as defined in claim 15, where the auto-tuned apparatus is further provided with a receiving means for receiving from an external apparatus information representative of the center frequency and the bandwidth to be set in the parallel multistage band-pass filter.

19. The auto-tuned apparatus as defined in claim 16, where the auto-tuned apparatus is further provided with an input means for inputting the center frequency and the bandwidth to be set in the described multi-pole parallel connected band-pass filter.

20. The auto-tuned apparatus as defined in claim 16, where the auto-tuned apparatus is further provided with a receiving means for receiving from an external apparatus the information representative of the center frequency and the bandwidth to be set in the parallel connected multistage band-pass filter.

21. The auto-tuned apparatus as defined in any of claims 15, 16, 17, 18, 19 or 20 where each band-pass filter is respectively provided with a resonator, the control means respectively computes each resonance frequency of each of the resonators in accordance with each direct current component outputted from the low-pass filtering means, and controls each of the band-pass filters so that the center frequency of each of the band-pass filters agrees with the frequency of each of the reference signals respectively in accordance with each resonance frequency to be computed.

22. A multi-pole auto-tuned parallel connected band-pass filter comprising a multi-pole parallel connected band-pass filter where a plurality of band-pass filters capable of changing the center frequencies are electrically connected in parallel, and an auto-tuned apparatus as described in claim 21.

23. A transmitter multiplexer, comprising a plurality of multi-pole auto-tuned parallel connected band-pass filters as described in claim 22, the output terminals of each of the multi-pole auto-tuned parallel connected band-pass filters, which output respective signals from each band-pass filter within each of the multi-pole auto-tuned parallel connected band-pass filters, are electrically connected together.

24. The auto-tuned apparatus as defined in any of claims 15, 16, 17, 18, 19 or 20, where each of the band-pass filters is respectively provided with a resonator, the control means controls the signal generating means so that the frequency of each of the reference signals agrees respectively with the center frequency of each of the band-pass filters in accordance with each direct current component outputted from the low-pass filtering means so as to change the frequency of each of the reference signals, and controls each of the band-pass filters so that the center frequency of each of the band-pass filters agrees with the frequency of each of the reference signals in accordance with the frequency of each of the reference signals changed.

25. A multi-pole auto-tuned parallel connected band-pass filter comprising a multi-pole parallel connected band-pass filter where a plurality of band-pass filters capable of changing the center frequencies are electrically connected in parallel, and an auto-tuned apparatus as described in claim 24.

26. A transmitter multiplexer, comprising a plurality of multi-pole auto-tuned parallel connected band-pass filters as described in claim 25, the output terminals of each of the multi-pole auto-tuned parallel connected band-pass filters, which output respective signals from each band-pass filter within each of the multi-pole auto-tuned parallel connected band-pass filters are electrically connected together.

27. A multi-pole auto-tuned parallel connected band-pass filter comprising a multi-pole parallel connected band-pass filter where a plurality of band-pass filters capable of changing the center frequencies are electrically connected in parallel, and an auto-tuned apparatus as described in any of claims 15, 16, 17, 18, 19 or 20.

28. A transmitter multiplexer, comprising a plurality of multi-pole auto-tuned parallel connected band-pass filters as described in claim 27, the output terminals of each of the multi-pole auto-tuned parallel connected band-pass filters, which output respective signals from each band-pass filter within each of the multi-pole auto-tuned parallel connected band-pass filters, are electrically connected together.

* * * * *